US006444327B1

(12) United States Patent
Yuda et al.

(10) Patent No.: US 6,444,327 B1
(45) Date of Patent: Sep. 3, 2002

(54) SILICON OXIDE FILM, METHOD OF FORMING THE SILICON OXIDE FILM, AND APPARATUS FOR DEPOSITING THE SILICON OXIDE FILM

(75) Inventors: Katsuhisa Yuda; Hiroshi Tanabe, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/556,427

(22) Filed: Apr. 24, 2000

Related U.S. Application Data

(62) Division of application No. 09/082,583, filed on May 21, 1998.

(30) Foreign Application Priority Data

May 21, 1997 (JP) .............................................. 9-131072

(51) Int. Cl.$^7$ .............................................. C01B 33/113
(52) U.S. Cl. ...................... 428/450; 428/446; 428/469; 423/335
(58) Field of Search .................................. 428/446, 450, 428/448, 469; 427/255.37; 423/335, 336, 337

(56) References Cited

U.S. PATENT DOCUMENTS

| 4,920,917 | A | | 5/1990 | Nakatani et al. | |
| 5,010,276 | A | | 4/1991 | Echizen et al. | |
| 5,314,724 | A | * | 5/1994 | Tsukune ..................... | 427/489 |
| 5,370,904 | A | * | 12/1994 | Mine et al. ............... | 427/126.2 |
| 5,372,842 | A | * | 12/1994 | Mine et al. ............... | 427/126.2 |
| 6,057,242 | A | * | 5/2000 | Kishimoto .................. | 428/692 |

FOREIGN PATENT DOCUMENTS

| EP | 0428839 A1 | * | 9/1990 |
| JP | 360162775 A | * | 8/1985 |
| JP | 404191374 A | * | 7/1992 |
| JP | 5-21393 | | 1/1993 |
| JP | 405267480 A | * | 10/1993 |
| JP | 406132281 A | * | 5/1994 |

(List continued on next page.)

OTHER PUBLICATIONS

G. Lucovsky et al., "Deposition of silicon dioxide and silicon nitride by remote plasma enhanced chemical vapor deposition", pp. 681–688, J. Vacuum Society Technology A, vol. 4, No. 3, May/Jun. 1986.

M. Liehr et al., "Low pressure chemical vapor deposition of oxide from $SiH_4/O_2$: Chemistry and effects on electrical properties", pp. 1980200, Appl. Phys. Lett., vol. 60, No. 2, Jan. 13, 1992.

N. Sano et al., "A new technique for diagnostics of a radio–frequency parallel–plate remote plasma", pp. 162–164, Appl. Phys. Lett., vol. 65, No. 2, Jul. 11, 1994.

M. Sekiya et al., "High Performance Poly–Crystalline Silicon Thin Film Transistors Fabricated Using Remote Plasma Chemical Vapor Deposition of $SiO_2$", pp. 69–71, IEEE Electron Device Letters, vol. 15, No. 2, Feb. 1994.

Primary Examiner—Deborah Jones
Assistant Examiner—Stephen Stein
(74) Attorney, Agent, or Firm—Young & Thompson

(57) ABSTRACT

A silicon oxide film has a ratio of $A_1$ to $A_2$ which is not higher than 0.21, where $A_1$ is a first peak integrated intensity of a first peak belonging to Si—OH and appearing in the vicinity of a wave-number of 970 $cm^{-1}$, and $A_2$ is a second peak integrated intensity of a second peak belonging to O—Si—O and appearing in the vicinity of a wave-number 820 $cm^{-1}$, and each of the first and second peak integrated intensities is defined as a product of peak width at half height and a peak height of a Raman spectrum obtained by a Raman scattering spectroscopic analysis of the silicon oxide film. The silicon oxide film is deposited under a condition that a ratio of a first flow rate Fo of oxygen gas to a second flow rate Fsi of a silicon source gas is not lower than 20.

11 Claims, 13 Drawing Sheets

FOREIGN PATENT DOCUMENTS

| | | |
|---|---|---|
| JP | 6-236850 | 8/1994 |
| JP | 7-312348 | 11/1995 |
| JP | 7-321102 | 12/1995 |
| JP | 7-335880 | 12/1995 |
| JP | 8-45858 | 2/1996 |
| JP | 8-167596 | 6/1996 |
| JP | 8-288271 | 11/1996 |
| JP | 9-50990 | 2/1997 |

* cited by examiner

Peak Integrated Intensity Ratio $A_1/A_2$ (y-axis: Fixed Charge Density Of Silicon Oxide Film ($\times 10^{11}$ cm$^{-2}$))

SILICON OXIDE FILM, METHOD OF FORMING THE SILICON OXIDE FILM, AND APPARATUS FOR DEPOSITING THE SILICON OXIDE FILM

CROSS-REFERENCE TO RELATED APPLICATIONS

This application is a division of copending application Ser. No. 09/082,583, filed May 21, 1998.

BACKGROUND OF THE INVENTION

The present invention relates to an improvement in a silicon oxide film, and a method of forming a silicon oxide film as well as a parallel-plate remote plasma enhanced chemical vapor deposition apparatus for depositing a silicon oxide film over a rectangular shaped substrate, and more particularly to a silicon oxide film reduced in content of hydroxyl group materials, and a method of forming a silicon oxide film reduced in content of hydroxyl group materials as well as a parallel-plate remote plasma enhanced chemical vapor deposition apparatus for uniformly depositing a silicon oxide film reduced in content of hydroxyl group materials over a rectangular shaped substrate with a large area.

The silicon oxide films are used in various semiconductor devices, for example, a gate insulation film of a field effect transistor, an inter-layer insulator, a field oxide film and a passivation layer covering the semiconductor device as well as a passivation layer used during fabrication processes of the semiconductor device. The silicon oxide film may be formed in a thermal oxidation method, a low pressure thermal chemical vapor deposition method and a plasma chemical vapor deposition and an atmospheric pressure thermal chemical vapor deposition method, and a sputtering method. In the chemical vapor deposition method, a silicon source gas such as monosilane ($SiH_4$), disilane ($Si_2H_6$), and TEOS ($Si(OC_2H_5)_4$) and an oxygen source gas are fed to a reaction chamber for causing a reaction at a relative low temperature in the range of 300–600° C. with an assist with a thermal energy and a plasma energy to form a silicon oxide film. For those reasons, the CVD silicon oxide films are often used in the semiconductor devices.

The CVD silicon oxide film is likely to include or capture hydroxyl group materials such as water $H_2O$ and silanol Si—OH. Such the hydroxyl group materials cause deteriorations in electric properties and characteristics and also deteriorations in reliability of device operation and performance as well as in reliability of device process. If the CVD silicon oxide film is used as the gate insulation film, then those deteriorations are serious problems.

The reasons why the CVD silicon oxide film is likely to include the hydroxyl group materials such as water $H_2O$ and silanol Si—OH are that the hydroxyl group materials are likely to be generated by the reaction of the source gases and also that if the silicon oxide film is porous and has a low film density, then waters are likely to be captured in the pores of the silicon oxide film. The hydroxyl group materials such as silanol Si—OH are structurally incorporated in the silicon oxide film, for which reason the hydroxyl group materials cause deteriorations in electric property and characteristic and reliability as insulator. It is possible to prevent pore-sites of the silicon oxide film from capturing water by covering a layer over the silicon oxide film. However, the hydroxyl group materials are generated by the reaction of the source gases, for which reason it is difficult to prevent the generation of the hydroxyl group materials. As a silicon source gas, monosilane ($SiH_4$), disilane ($Si_2H_6$), and TEOS ($Si(OC_2H_5)_4$) are available which include hydrogen atoms. If such the silicon source gas is reacted with an oxygen source gas, then the hydroxyl group materials are generated. Further, when the silicon oxide film is deposited by the plasma enhanced chemical vapor deposition method, hydrogen radicals are formed whereby the generation of the hydroxyl group materials is promoted. As a result, the content of the hydroxyl group materials in the silicon oxide film is increased. TICS ($Si(NCO)_4$) free of hydrogen is also available as a silicon source gas. The silicon oxide film made from TICS ($Si(NCO)_4$) is inferior for practicing the semiconductor device.

The silicon oxide films deposited by the chemical vapor deposition method using reaction of monosilane with oxygen-containing gas have been studied and developed, wherein a reduction in content of the hydroxyl group materials in the silicon oxide film.

In Applied Physics Letters, vol. 60, No. 2, pp. 198, it is disclosed that the increase in substrate temperature in the low pressure thermal chemical vapor deposition using monosilane and oxygen gas results in reduction in the content of the hydroxyl group materials in the silicon oxide film. This method of mere increase in substrate temperature is not effective for reduction in the content of the hydroxyl group materials in the silicon oxide film unless the substrate temperature is risen to not less than 600° C. This method of increasing the substrate temperature to not less than 600° C. is inapplicable to when the silicon oxide film is deposited over a glass substrate or when the silicon oxide film is deposited on a metal interconnection layer of a low melting point.

In Japanese laid-open patent publication No. 62-190760, it is disclosed that monosilane, carbon dioxide gas ($CO_2$) and nitrogen gas ($N_2$) are used as source gases to form a silicon nitride oxide film by the plasma enhanced chemical vapor deposition method thereby reducing the content of the hydroxyl group materials in the silicon nitride oxide film. Such a CVD silicon nitride oxide film is available for inter-layer insulator and passivation film. If the CVD silicon nitride oxide film is formed as a gate insulation film on a silicon layer or a silicon substrate, an interface state density is higher than when the gate insulation film comprises the silicon oxide film on the silicon substrate or the silicon layer.

In Journal of Vacuum Science and Technology, vol. 4, No. 3, pp. 681, there is disclosed a remote plasma enhanced chemical vapor deposition method which settles the problem like that hydrogen radicals promote generation of the hydroxyl group materials in the silicon oxide film. Only oxygen source gas is supplied or oxygen source gas and inert gas are supplied for causing a plasma thereby generating oxygen radicals so that the oxygen radicals are diffused toward the substrate and further a silicon source gas which is electrically neutral is fed in the vicinity of the substrate, whereby the silicon source gas is reacted with the oxygen radicals, without generating hydrogen radicals, to form a silicon oxide film by the plasma chemical vapor deposition. This remote plasma chemical vapor deposition method does not suppress a reaction of monosilane with oxygen source gas which generates the hydroxyl group materials. Namely, the remote plasma chemical vapor deposition method does not settle the problem with generation of the hydroxyl group materials in the silicon oxide film.

In the above Journal of Vacuum Science and Technology, it is also disclosed that the gas injector for injecting monosilane gas is circularshaped. If this gas injector is used for depositing a silicon oxide film over a rectangular-shaped glass substrate which is often used for a liquid crystal display device, then a further problem is raised with non-uniformity of the silicon oxide film or variation in thickness of the silicon oxide film over position. This problem is remarkable when the rectangular-shaped substrate has a large size.

In IEEE Electron Device Letters, vol. 15, No. 2, pp. 69, it is disclosed that a parallel-plate remote plasma chemical vapor deposition apparatus is applicable to a large size substrate, wherein an intermediate mesh plate electrode and a silicon source gas injector are provided so that an oxygen plasma generation region is separated in space from a silicon source gas injection region and the substrate.

In Japanese laid-open patent publication No. 5-21393, it is disclosed that, in the parallel-plate remote plasma enhanced chemical vapor deposition apparatus, the silicon source gas injector is provided in the vicinity of the intermediate mesh plate electrode in order to attempt to uniformly deposit of the silicon oxide film over the large size substrate as illustrated in FIG. 1. The parallel-plate remote plasma chemical vapor deposition and the intermediate mesh plate electrode as well as monosilane gas injector are cylindrically shaped as illustrated in FIG. 2. This parallel-plate remote plasma chemical vapor deposition apparatus is applicable but only to the circular-shaped substrate and thus inapplicable to the rectangular-shaped substrate which is often used for the liquid crystal display device.

In the above circumstances, it had been required to develop a novel silicon oxide film with a reduced content of the hydroxyl group materials, and a method of forming a novel silicon oxide film with a reduced content of the hydroxyl group materials as well as a parallel-plate remote chemical vapor deposition apparatus capable of uniform deposition of a silicon oxide film over a rectangular-shaped substrate.

SUMMARY OF THE INVENTION

Accordingly, it is an object of the present invention to provide a novel silicon oxide film free from the above problems.

It is a further object of the present invention to provide a novel silicon oxide film with a reduced content of the hydroxyl group materials.

It is a still further object of the present invention to provide a novel silicon oxide film with excellent electrical properties and characteristics.

It is yet a further object of the present invention to provide a novel silicon oxide film with high reliability as an insulator.

It is a further more object of the present invention to provide a novel method of forming a silicon oxide film free from the above problems.

It is still more object of the present invention to provide a novel method of forming a silicon oxide film with a reduced content of the hydroxyl group materials.

It is moreover object of the present invention to provide a novel method of forming a silicon oxide film with excellent electrical properties and characteristics.

It is another object of the present invention to provide a novel method of forming a silicon oxide film with high reliability as insulator.

It is still another object of the present invention to provide a parallel-plate remote chemical vapor deposition apparatus free from the above problems.

It is yet another object of the present invention to provide a parallel-plate remote chemical vapor deposition apparatus capable of uniform deposition of a silicon oxide film over a rectangular-shaped substrate.

It is further another object of the present invention to provide a remote chemical vapor deposition apparatus free from the above problems.

It is an additional object of the present invention to provide a remote chemical vapor deposition apparatus capable of uniform deposition of a silicon oxide film over a rectangular-shaped substrate.

The present invention provides a silicon oxide film having a ratio of $A_1$ to $A_2$ which is not higher than 0.21, where $A_1$ is a first peak integrated intensity of a first peak belonging to Si—OH and appearing in the vicinity of a wave-number of 970 $cm^{-1}$, and $A_2$ is a second peak integrated intensity of a second peak belonging to O—Si—O and appearing in the vicinity of a wave-number 820 $cm^{-1}$, and each of the first and second peak integrated intensities is defined as a product of peak width at half height and a peak height of a Raman spectrum obtained by a Raman scattering spectroscopic analysis of the silicon oxide film.

The present invention also provides a chemical vapor deposition method comprising the step of depositing a silicon oxide film, wherein a ratio of a first flow rate Fo of oxygen gas to a second flow rate Fsi of a silicon source gas is not lower than 20.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
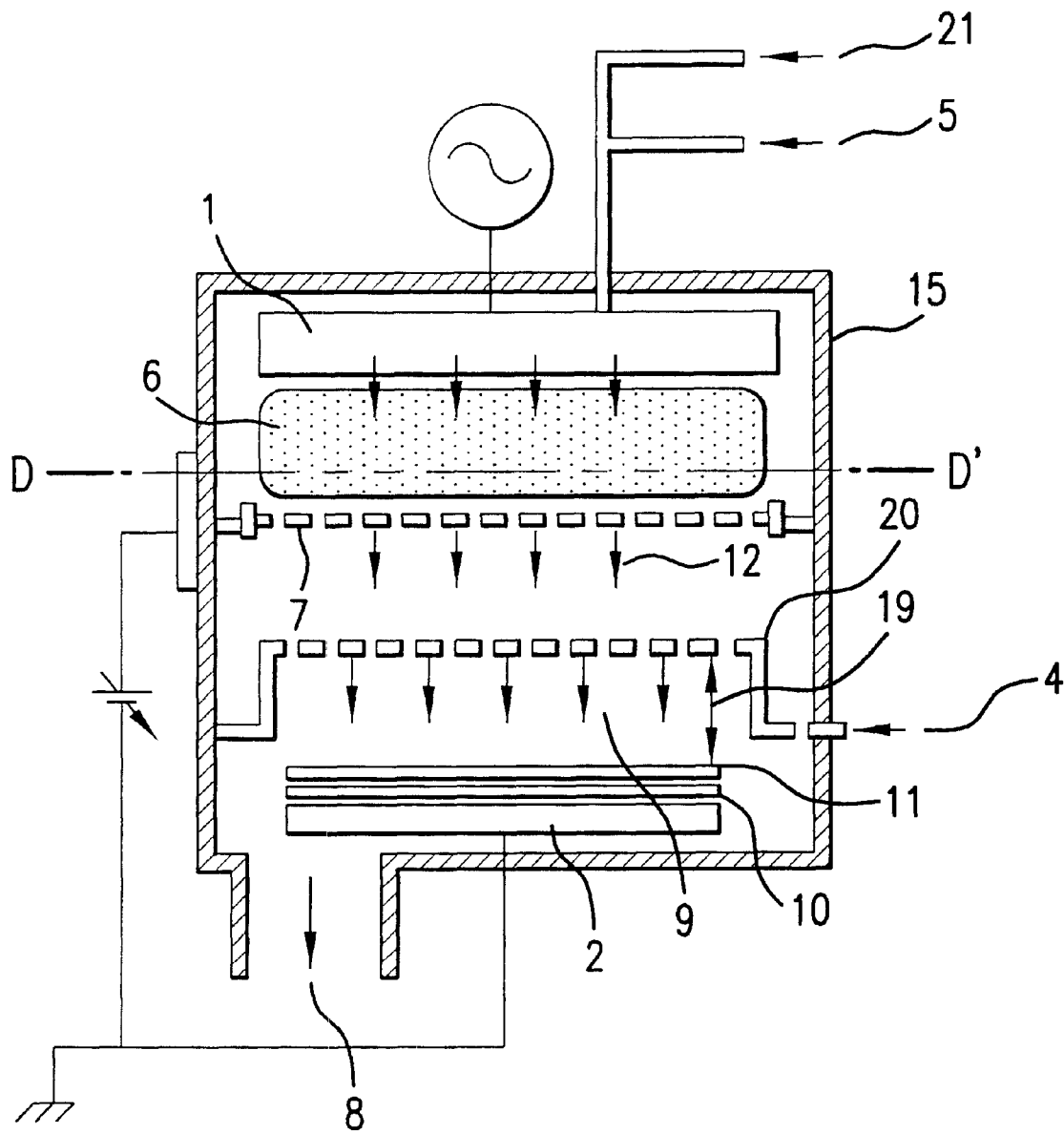
FIG. 1 is a schematic cross sectional elevation view illustrative of the conventional parallel-plate remote plasma chemical vapor deposition apparatus having a ring-shaped gas injector.
Figure 2:
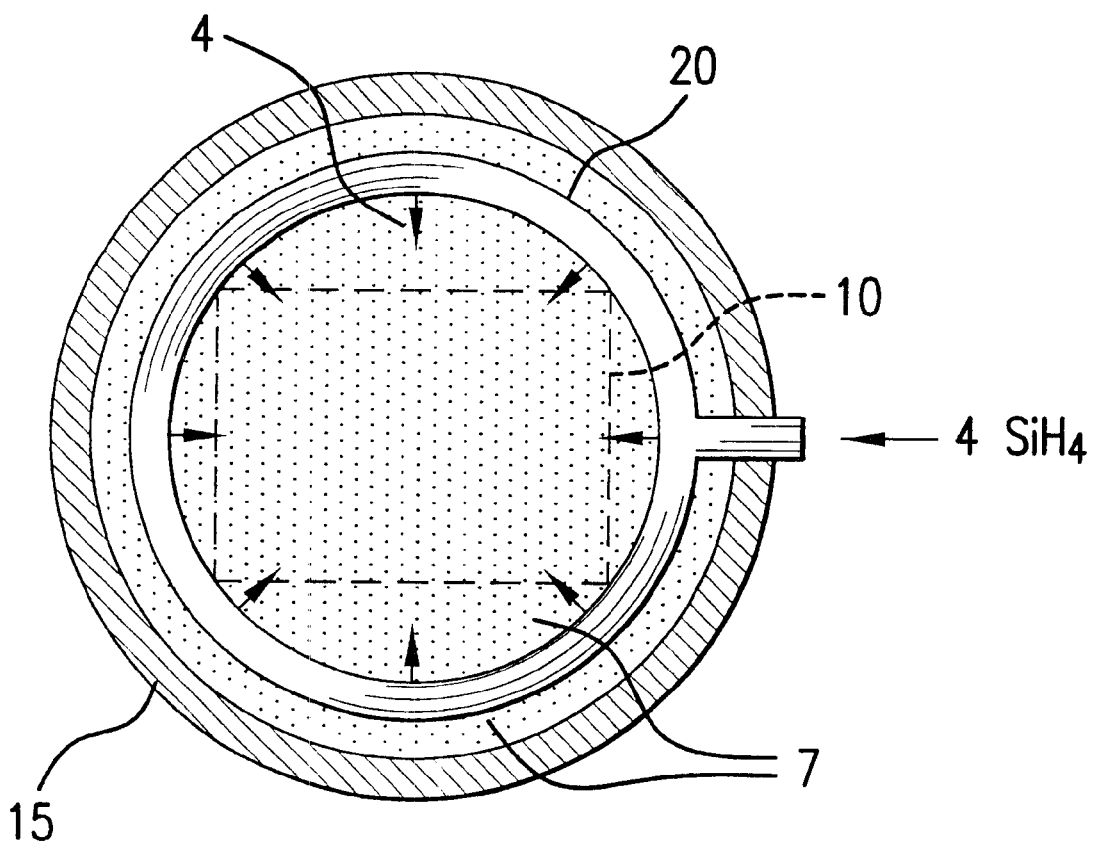
FIG. 2 is a plan view illustrative of a ring-shaped gas injector used in the conventional parallel-plate remote plasma chemical vapor deposition apparatus of FIG. 1.

The first aspect of the present invention provides a silicon oxide having a ratio of $A_1$ to $A_2$ which is not higher than 0.21, where $A_1$ is a first peak integrated intensity of a first peak belonging to Si—OH and appearing in the vicinity of a wave-number of 970 cm$^{-1}$, and $A_2$ is a second peak integrated intensity of a second peak belonging to O—Si—O and appearing in the vicinity of a wave-number 820 cm$^{-1}$, and each of the first and second peak integrated intensities is defined as a product of peak width at half height and a peak height of a Raman spectrum obtained by a Raman scattering spectroscopic analysis of the silicon oxide film.

The ratio of $A_1$ to $A_2$ may be not lower than 0.01 and not higher than 0.21. Further the ratio of $A_1$ to $A_2$ may be not lower than 0.05 and not higher than 0.21.

The second aspect of the present invention provides a silicon oxide film having a ratio of $A_1$ to $A_2$ which is not higher than 0.21, where $A_1$ is a first peak integrated intensity of a first peak belonging to Si—OH and appearing in the vicinity of a wave-number 970 cm$^{-1}$, and $A_2$ is a second peak integrated intensity of a second peak belonging to O—Si—O and appearing in the vicinity of a wave-number 820 cm$^{-1}$, and each of the first and second peak integrated intensities is defined as a product of peak width at half height and a peak height of a Raman spectrum obtained by a Raman scattering spectroscopic analysis of the silicon oxide film.

The ratio of $A_1$ to $A_2$ may be not lower than 0.01 and not higher than 0.21. Further the ratio of $A_1$ to $A_2$ may be not lower than 0.05 and not higher than 0.21.

It is also possible that the silicon oxide film is in direct contact with a single crystal silicon.

It is also possible that the silicon oxide film is in direct contact with a polycrystal silicon.

It is also possible that the silicon oxide film is in direct contact with a compound semiconductor.

It is also possible that the silicon oxide film is in direct contact with a metal.

It is also possible that the silicon oxide film is in direct contact with an insulator.

The third aspect of the present invention provides a chemical vapor deposition method comprising the step of depositing a silicon oxide film, wherein a ratio of a first flow rate Fo of oxygen gas to a second flow rate Fsi of a silicon source gas is not lower than 20.

It is preferable that the silicon oxide film is subjected to a heat treatment at a temperature in the range of 500–600° C.

It is also preferable that the silicon oxide film is deposited on a silicon substrate which is maintained at a substrate temperature in the range of 350–600° C.

The silicon oxide film is deposited in a parallel-plate remote plasma enhanced chemical vapor deposition reactor.

The fourth aspect of the present invention provides a chemical vapor deposition method comprising the step of depositing a silicon oxide film on a substrate kept at a substrate temperature of not lower than about 300° C., wherein a ratio of a first flow rate Fo of oxygen gas to a second flow rate Fsi of a silicon source gas is not lower than 30.

It is preferable that the silicon oxide film is subjected to a heat treatment at a temperature in the range of 500–600° C.

It is also preferable that the silicon oxide film is deposited in a parallel-plate remote plasma enhanced chemical vapor deposition reactor.

In accordance with the above first to fourth aspects of the present inventions, the silicon oxide film is reduced in content of hydroxyl group materials such as water $H_2O$ and silanol Si—OH in the silicon oxide film. The ratio of the first peak integrated intensity $A_1$ of the first peak belonging to Si—OH and appearing in the vicinity of the wave-number of 970 cm$^{-1}$ to the second peak integrated intensity $A_2$ of the second peak belonging to O—Si—O and appearing in the vicinity of a wave-number 820 cm$^{-1}$ depends upon the content of hydroxyl group materials in the silicon oxide film. The above peak integrated intensity ratio $A_1$ to $A_2$ represents the normalizated amount of the hydroxyl group materials such as silanol Si—OH in the silicon oxide film. If the peak integrated intensity ratio $A_1$ to $A_2$ is high, this means that the content of the hydroxyl group materials such as water $H_2O$ and silanol Si—OH in the silicon oxide film is also high. If, however, the peak integrated intensity ratio $A_1$ to $A_2$ is low, this means that the content of the hydroxyl group materials such as water $H_2O$ and silanol Si—OH in the silicon oxide film is also low.

Figure 3:
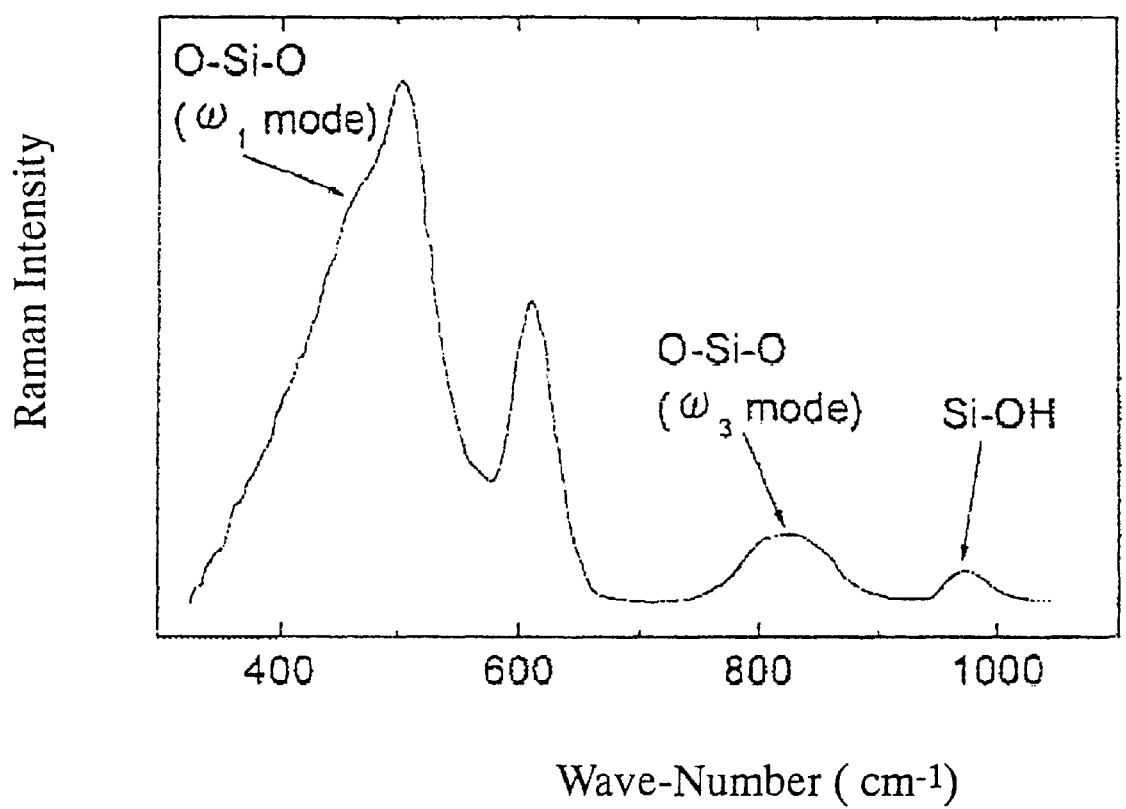
FIG. 3 is a diagram illustrative of a typical Raman spectrum of the silicon oxide film. This Raman spectrum is obtained by Raman scattering spectroscopic analysis of the silicon oxide film.

FIG. 3 is a diagram illustrative of a typical Raman spectrum of the silicon oxide film. This Raman spectrum is obtained by Raman scattering spectroscopic analysis of the silicon oxide film. A peak belonging to an $\omega_1$-mode of O—Si—O network appears in the vicinity of a wave-number of 450–500 cm$^{-1}$. A peak belonging to an $\omega_3$-mode of O—Si—O network appears in the vicinity of a wave-number of 820 cm$^{-1}$. A peak belonging to a stretch mode of Si—OH bonding appears in the vicinity of a wave-number of 970 cm$^{-1}$.

Figure 4:
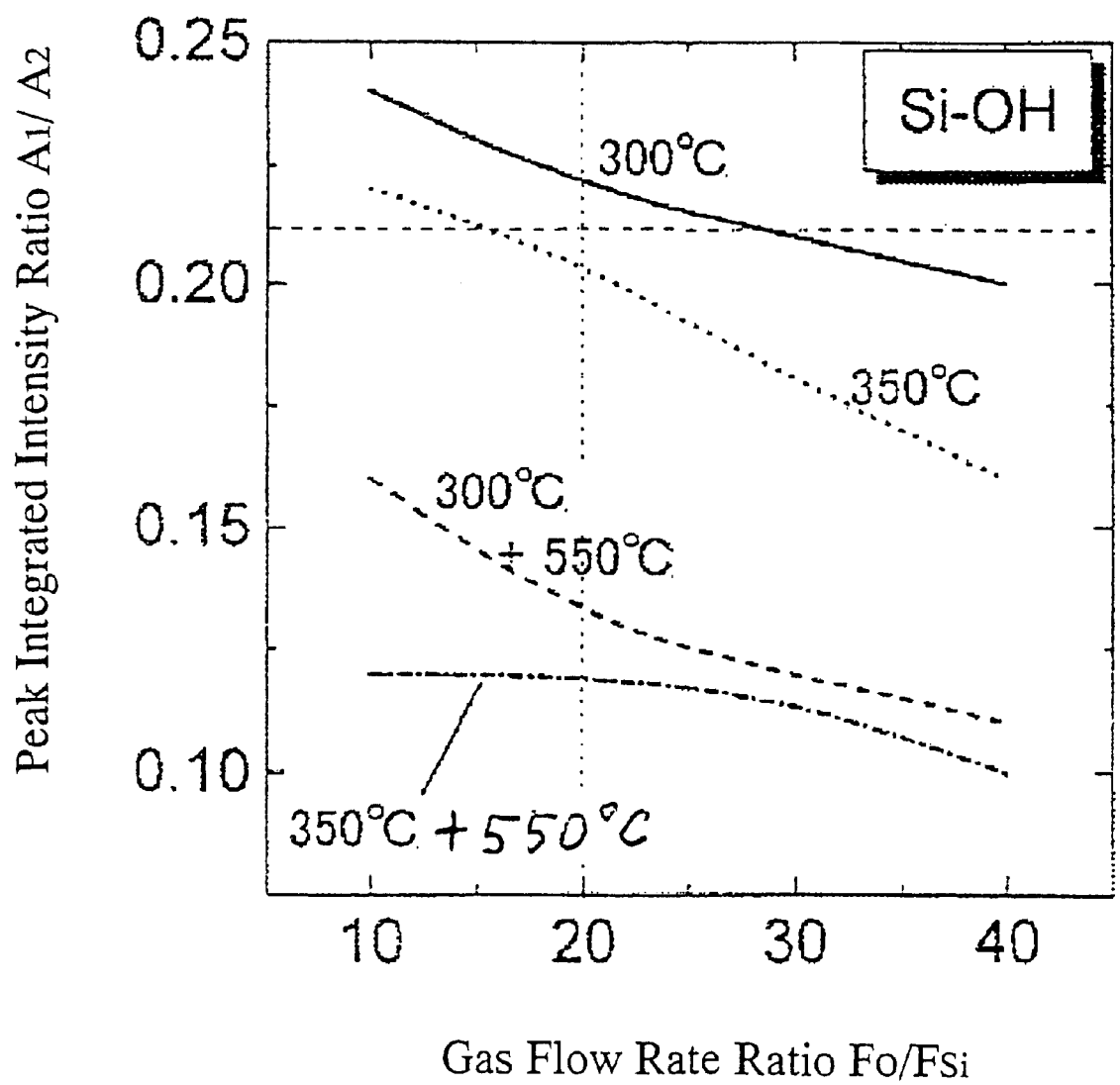
FIG. 4 is a diagram illustrative of variations in a ratio of the first peak integrated intensity $A_1$ of the first peak belonging to Si—OH to the second peak integrated intensity $A_2$ of the second peak belonging to O—Si—O versus a ratio of the first flow rate Fo of oxygen gas to the second flow rate Fsi of the silicon source gas in accordance with the present invention.

FIG. 4 is a diagram illustrative of variations in a ratio of the first peak integrated intensity $A_1$ of the first peak belonging to Si—OH to the second peak integrated intensity $A_2$ of the second peak belonging to O—Si—O versus a ratio of the first flow rate Fo of oxygen gas to the second flow rate Fsi of the silicon source gas. A real line represents the variation in ratio of the first peak integrated intensity $A_1$ to the second peak integrated intensity $A_2$ versus the ratio of the first flow rate Fo to the second flow rate Fsi when the silicon oxide film has been deposited at a substrate temperature of 300° C. followed by no heat treatment. A dotted line represents the variation in ratio of the first peak integrated intensity $A_1$ to the second peak integrated intensity $A_2$ versus the ratio of the first flow rate Fo to the second flow rate Fsi when the silicon oxide film has been deposited at a substrate temperature of 350° C. followed by no heat treatment. A broken line represents the variation in ratio of the first peak integrated intensity $A_1$ to the second peak integrated intensity $A_2$ versus the ratio of the first flow rate Fo to the second flow rate Fsi when the silicon oxide film has been deposited at a substrate temperature of 300° C. followed by a heat treatment at a temperature of 550° C. for 8 hours. An alternate long and short dash line represents the variation in ratio of the first peak integrated intensity $A_1$ to the second peak integrated intensity $A_2$ versus the ratio of the first flow rate Fo to the second flow rate Fsi when the silicon oxide film has been deposited at a substrate temperature of 350° C. followed by a heat treatment at a temperature of 550° C. for 8 hours.

The solid line shows that if the chemical vapor deposition of the silicon oxide film is carried out at the substrate temperature of 300° C. for subsequent no heat treatment, then the increase in the ratio of the first flow rate Fo of the oxygen gas to the second flow rate Fsi of the silicon source gas results in a simple decrease in the ratio of the first peak integrated intensity $A_1$ of the first peak belonging to Si—OH to the second peak integrated intensity $A_2$ of the second peak belonging to O—Si—O. As described above if the peak integrated intensity ratio $A_1$ to $A_2$ is low, this means that the content of the hydroxyl group materials such as water $H_2O$ and silanol Si—OH in the silicon oxide film is also low. Therefore, the increase in the ratio of the first flow rate Fo of the oxygen gas to the second flow rate Fsi of the silicon source gas results in a reduction in the content of the hydroxyl group materials such as water $H_2O$ and silanol Si—OH in the silicon oxide film. In order to obtain the peak integrated intensity ratio $A_1$ to $A_2$ of not higher than 0.21, it is required that the ratio of the first flow rate Fo of the oxygen gas to the second flow rate Fsi of the silicon source gas is not lower than 30. Namely, if the silicon oxide film is deposited by the chemical vapor deposition at the substrate temperature 300° C. for subsequent no heat treatment under the condition that the ratio of the first flow rate Fo of the oxygen gas to the second flow rate Fsi of the silicon source gas is not lower than 30, then the ratio of the first peak integrated intensity $A_1$ of the first peak belonging to Si—OH to the second peak integrated intensity $A_2$ of the second peak belonging to O—Si—O is not higher than 0.21.

Accordingly, if the ratio of the first flow rate Fo of the oxygen gas to the second flow rate Fsi of the silicon source gas is increased, then the ratio of the first peak integrated intensity $A_1$ of the first peak belonging to Si—OH to the second peak integrated intensity $A_2$ of the second peak belonging to O—Si—O is decreased and further the content of the hydroxyl group materials such as water $H_2O$ and silanol Si—OH in the silicon oxide film is also decreased. Considering that the silicon source gas comprises a monosilane, a reaction of oxygen with monosilane is caused. If the reaction is caused under an oxygen rich condition or the ratio of the first flow rate Fo of the oxygen gas to the second flow rate Fsi of the monosilane gas is high, then a larger amount of water is generated than hydrogen. By contrast, if, however, the reaction is caused under a silicon source rich condition or the ratio of the first flow rate Fo of the oxygen gas to the second flow rate Fsi of the monosilane gas is low, then a silicon rich silicon oxide film is formed. This silicon rich silicon oxide film has many defects and a low film density. Namely, the silicon rich silicon oxide film is porous whereby silanol Si—OH is captured and water is absorbed.

The dotted line shows that if the chemical vapor deposition of the silicon oxide film is carried out at the substrate temperature of 350° C. for subsequent no heat treatment, then the increase in the ratio of the first flow rate Fo of the oxygen gas to the second flow rate Fsi of the silicon source gas results in a simple decrease in the ratio of the first peak integrated intensity $A_1$ of the first peak belonging to Si—OH to the second peak integrated intensity $A_2$ of the second peak belonging to O—Si—O. As described above if the peak integrated intensity ratio $A_1$ to $A_2$ is low, this means that the content of the hydroxyl group materials such as water $H_2O$ and silanol Si—OH in the silicon oxide film is also low. Therefore, the increase in the ratio of the first flow rate Fo of the oxygen gas to the second flow rate Fsi of the silicon source gas results in a reduction in the content of the hydroxyl group materials such as water $H_2O$ and silanol Si—OH in the silicon oxide film. In order to obtain the peak integrated intensity ratio $A_1$ to $A_2$ of not higher than 0.21, it is required that the ratio of the first flow rate Fo of the oxygen gas to the second flow rate Fsi of the silicon source gas is not lower than 16. Namely, if the silicon oxide film is deposited by the chemical vapor deposition at the substrate temperature 350° C. for subsequent no heat treatment under the condition that the ratio of the first flow rate Fo of the oxygen gas to the second flow rate Fsi of the silicon source gas is not lower than 16, then the ratio of the first peak integrated intensity $A_1$ of the first peak belonging to Si—OH to the second peak integrated intensity $A_2$ of the second peak belonging to O—Si—O is not higher than 0.21.

Accordingly, if the ratio of the first flow rate Fo of the oxygen gas to the second flow rate Fsi of the silicon source gas is increased, then the ratio of the first peak integrated intensity $A_1$ of the first peak belonging to Si—OH to the second peak integrated intensity $A_2$ of the second peak belonging to O—Si—O is decreased and further the content of the hydroxyl group materials such as water $H_2O$ and silanol Si—OH in the silicon oxide film is also decreased. Considering that the silicon source gas comprises a monosilane, a reaction of oxygen with monosilane is caused. If the reaction is caused under an oxygen rich condition or the ratio of the first flow rate Fo of the oxygen gas to the second flow rate Fsi of the monosilane gas is high, then a larger amount of water is generated than hydrogen. By contrast, however, if the reaction is caused under a silane system material rich condition or the ratio of the first flow rate Fo of the oxygen gas to the second flow rate Fsi of the monosilane gas is low, then a silicon rich silicon oxide film is formed. This silicon rich silicon oxide film has many defects and a low film density. Namely, the silicon rich silicon oxide film is porous whereby silanol Si—OH is captured and water is absorbed.

By comparison of the dotted line with the solid line, it is understood that if the silicon oxide film is deposited at the same ratio of the first flow rate Fo of the oxygen gas to the second flow rate Fsi of the monosilane gas, then the higher substrate temperature condition causes the lower ratio of the first peak integrated intensity $A_1$ of the first peak belonging to Si—OH to the second peak integrated intensity $A_2$ of the second peak belonging to O—Si—O and also causes the lower content of the hydroxyl group materials such as water $H_2O$ and silanol Si—OH in the silicon oxide film. Namely, the increase in substrate temperature in the chemical vapor deposition of the silicon oxide film results in drop in the ratio of the first peak integrated intensity $A_1$ of the first peak belonging to Si—OH to the second. peak integrated intensity $A_2$ of the second peak belonging to O—Si—O and also drop in the content of the hydroxyl group materials such as water $H_2O$ and silanol Si—OH in the silicon oxide film. In the reaction of oxygen with monosilane during the chemical vapor deposition, hydroxide as a precursor for silanol Si—OH may be adhered on a silicon substrate. However, the thermal energy from the substrate kept at the substrate temperature causes elimination or dissociation of the hydroxide from the silicon substrate whereby the amount of hydroxide as a precursor for silanol Si—OH adhered on the silicon substrate is reduced. For this reason, an amount of the silanol Si—OH formed from hydroxide adhered on the silicon substrate is also reduced.

The broken line shows that if the chemical vapor deposition of the silicon oxide film is carried out at the substrate temperature of 300° C. for subsequent heat treatment at a temperature of 550° C. for 8 hours, then the increase in the ratio of the first flow rate Fo of the oxygen gas to the second flow rate Fsi of the silicon source gas results in a simple decrease in the ratio of the first peak integrated intensity $A_1$ of the first peak belonging to Si—OH to the second peak integrated intensity $A_2$ of the second peak belonging to O—Si—O. As described above if the peak integrated intensity ratio $A_1$ to $A_2$ is low, this means that the content of the hydroxyl group materials such as water $H_2O$ and silanol Si—OH in the silicon oxide film is also low. Therefore, the increase in the ratio of the first flow rate Fo of the oxygen gas to the second flow rate Fsi of the silicon source gas results in a reduction in the content of the hydroxyl group materials such as water $H_2O$ and silanol Si—OH in the silicon oxide film. In order to obtain the peak integrated intensity ratio $A_1$ to $A_2$ of not higher than 0.13, it is required that the ratio of the first flow rate Fo of the oxygen gas to the second flow rate Fsi of the silicon source gas is not lower than 20. Namely, if the silicon oxide film is deposited by the chemical vapor deposition at the substrate temperature 300° C. for subsequent heat treatment at 550° C. for 8 hours under the condition that the ratio of the first flow rate Fo of the oxygen gas to the second flow rate Fsi of the silicon source gas is not lower than 20, then the ratio of the first peak integrated intensity $A_1$ of the first peak belonging to Si—OH to the second peak integrated intensity $A_2$ of the second peak belonging to O—Si—O is not higher than 0.13.

Accordingly, if the ratio of the first flow rate Fo of the oxygen gas to the second flow rate Fsi of the silicon source gas is increased, then the ratio of the first peak integrated intensity $A_1$ of the first peak belonging to Si—OH to the second peak integrated intensity $A_2$ of the second peak belonging to O—Si—O is decreased and further the content of the hydroxyl group materials such as water $H_2O$ and silanol Si—OH in the silicon oxide film is also decreased. Considering that the silicon source gas comprises a monosilane, a reaction of oxygen with monosilane is caused. If the reaction is caused under an oxygen rich condition or the ratio of the first flow rate Fo of the oxygen gas to the second flow rate Fsi of the monosilane gas is high, then a larger amount of water is generated than hydrogen. By contrast, however, if the reaction is caused under a silicon source rich condition or the ratio of the first flow rate Fo of the oxygen gas to the second flow rate Fsi of the monosilane gas is low, then a silicon rich silicon oxide film is formed. This silicon rich silicon oxide film has many defects and a low film density. Namely, the silicon rich silicon oxide film is porous whereby silanol Si—OH is captured and water is absorbed.

As compared to the broken line with the solid line, it is understood that if the silicon oxide film is deposited at the same substrate temperature and also at the same ratio of the first flow rate Fo of the oxygen gas to the second flow rate Fsi of the monosilane gas, then the heat treatment carried out after the silicon oxide film deposition causes the much lower ratio of the first peak integrated intensity $A_1$ of the first peak belonging to Si—OH to the second peak integrated intensity $A_2$ of the second peak belonging to O—Si—O and also causes much lower content of the hydroxyl group materials such as water $H_2O$ and silanol Si—OH in the silicon oxide film. Namely, the heat treatment after the chemical vapor deposition of the silicon oxide film results in large drop in the ratio of the first peak integrated intensity $A_1$ of the first peak belonging to Si—OH to the second peak integrated intensity $A_2$ of the second peak belonging to O—Si—O and also large drop in the content of the hydroxyl group materials such as water $H_2O$ and silanol Si—OH in the silicon oxide film. The thermal energy given from the heat treatment after the chemical vapor deposition of the silicon oxide film causes dissociation of silanol Si—OH in the silicon oxide film and elimination of silanol Si—OH from the inside of the silicon oxide film. For this reason, the content of the silanol Si—OH in the silicon oxide film is also reduced.

The alternative long and short dash line shows that if the chemical vapor deposition of the silicon oxide film is carried out at the substrate temperature of 350° C. for subsequent heat treatment at 550° C. for 8 hours, then the increase in the ratio of the first flow rate Fo of the oxygen gas to the second flow rate Fsi of the silicon source gas results in a simple decrease in the ratio of the first peak integrated intensity $A_1$ of the first peak belonging to Si—OH to the second peak integrated intensity $A_2$ of the second peak belonging to O—Si—O. As described above if the peak integrated intensity ratio $A_1$ to $A_2$ is low, this means that the content of the hydroxyl group materials such as water $H_2O$ and silanol Si—OH in the silicon oxide film is also low. Therefore, the increase in the ratio of the first flow rate Fo of the oxygen gas to the second flow rate Fsi of the silicon source gas results in a reduction in the content of the hydroxyl group materials such as water $H_2O$ and silanol Si—OH in the silicon oxide film. In order to obtain the peak integrated intensity ratio $A_1$ to $A_2$ of not higher than 0.12, it is required that the ratio of the first flow rate Fo of the oxygen gas to the second flow rate Fsi of the silicon source gas is not lower than 20. Namely, if the silicon oxide film is deposited by the chemical vapor deposition at the substrate temperature 350° C. for subsequent heat treatment at 550° C. for 8 hours under the condition that the ratio of the first flow rate Fo of the oxygen gas to the second flow rate Fsi of the silicon source gas is not lower than 20, then the ratio of the first peak integrated intensity $A_1$ of the first peak belonging to Si—OH to the second peak integrated intensity $A_2$ of the second peak belonging to O—Si—O is not higher than 0.12.

Accordingly, if the ratio of the first flow rate Fo of the oxygen gas to the second flow rate Fsi of the silicon source gas is increased, then the ratio of the first peak integrated intensity $A_1$ of the first peak belonging to Si—OH to the second peak integrated intensity $A_2$ of the second peak belonging to O—Si—O is decreased and further the content of the hydroxyl group materials such as water $H_2O$ and silanol Si—OH in the silicon oxide film is also decreased. Considering that the silicon source gas comprises a monosilane, a reaction of oxygen with monosilane is caused. If the reaction is caused under an oxygen rich condition or the ratio of the first flow rate Fo of the oxygen gas to the second flow rate Fsi of the monosilane gas is high, then a larger amount of water is generated than hydrogen. By contrast, however, if the reaction is caused under a silicon source rich condition or the ratio of the first flow rate Fo of the oxygen gas to the second flow rate Fsi of the monosilane gas is low, then a silicon rich silicon oxide film is formed. This silicon rich silicon oxide film has many defects and a low film density. Namely, the silicon rich silicon oxide film is porous whereby silanol Si—OH is captured and water is absorbed.

By comparison of the alternative long and short dash line with the broken line, it is understood that if the silicon oxide film is deposited at the same ratio of the first flow rate Fo of the oxygen gas to the second flow rate Fsi of the monosilane gas and thereafter the heat treatment is carried out the same temperature and for the same time, then the higher substrate temperature condition causes the lower ratio of the first peak integrated intensity $A_1$ of the first peak belonging to Si—OH to the second peak integrated intensity $A_2$ of the second peak belonging to O—Si—O and also causes lower content of the hydroxyl group materials such as water $H_2O$ and silanol Si—OH in the silicon oxide film. Namely, the increase in substrate temperature in the chemical vapor deposition of the silicon oxide film results in drop in the ratio of the first peak integrated intensity $A_1$ of the first peak belonging to Si—OH to the second peak integrated intensity $A_2$ of the second peak belonging to O—Si—O and also drop in the content of the hydroxyl group materials such as water $H_2O$ and silanol Si—OH in the silicon oxide film. In the reaction of oxygen with monosilane during the chemical vapor deposition, hydroxide as a precursor for silanol Si—OH may be adhered on a silicon substrate. However, the thermal energy from the substrate kept at the substrate temperature causes elimination or dissociation of the hydroxide from the silicon substrate whereby the amount of hydroxide as a precursor for silanol Si—OH adhered on the silicon substrate is reduced. For this reason, an amount of the silanol Si—OH formed from hydroxide adhered on the silicon substrate is also reduced.

Further, as compared to the alternate long and short dash line with the dotted line, it is understood that if the silicon oxide film is deposited at the same substrate temperature and also at the same ratio of the first flow rate Fo of the oxygen gas to the second flow rate Fsi of the monosilane gas, then the heat treatment carried out after the silicon oxide film deposition causes the much lower ratio of the first peak integrated intensity $A_1$ of the first peak belonging to Si—OH to the second peak integrated intensity $A_2$ of the second peak belonging to O—Si—O and also causes the much lower content of the hydroxyl group materials such as water $H_2O$ and silanol Si—OH in the silicon oxide film. Namely, the heat treatment after the chemical vapor deposition of the silicon oxide film results in large drop in the ratio of the first peak integrated intensity $A_1$ of the first peak belonging to Si—OH to the second peak integrated intensity $A_2$ of the second peak belonging to O—Si—O and also large drop in the content of the hydroxyl group materials such as water $H_2O$ and silanol Si—OH in the silicon oxide film. The thermal energy given from the heat treatment after the chemical vapor deposition of the silicon oxide film causes dissociation of silanol Si—OH in the silicon oxide film and elimination of silanol Si—OH from the inside of the silicon oxide film. For this reason, the content of the silanol Si—OH in the silicon oxide film is also reduced.

Figure 5:
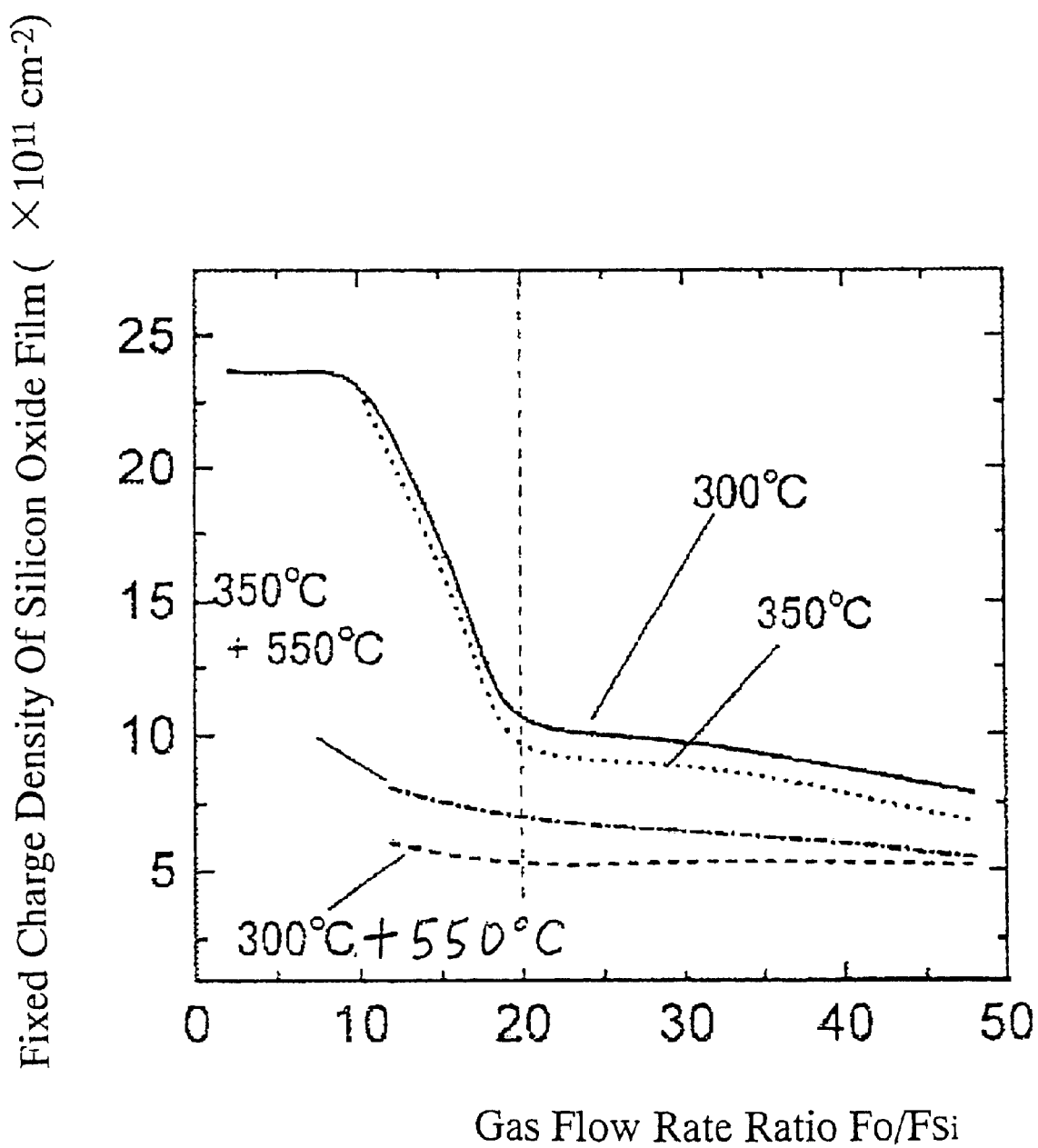
FIG. 5 is a diagram illustrative of variations in fixed charge density in the silicon oxide film versus a ratio of the first flow rate Fo of the oxygen gas to the second flow rate Fsi of the silicon source gas in accordance with the present invention.

FIG. 5 is a diagram illustrative of variations in oxide charge density in the silicon oxide film versus a ratio of the first flow rate Fo of the oxygen gas to the second flow rate Fsi of the silicon source gas. The fixed oxide charge density is calculated from a flat band voltage obtained from capacitance-voltage characteristics under high frequency conditions of a MOS capacitor wherein the silicon oxide film acts as a gate insulation film. It may be considered that the fixed charges in the silicon oxide film are due to excess silicon or silanol Si—OH. If the silicon oxide film having a small fixed oxide charge density is used as a gate insulation film, this makes it possible to drop a threshold voltage and a reduction in variation of the threshold voltage, thereby allowing the transistor to exhibit high performance. For those reasons, the fixed oxide charge density of the silicon oxide film may be used as indicator for electric characteristics or properties of the silicon oxide film.

A solid line represents variations in fixed oxide charge density of the silicon oxide film versus a ratio of the first flow rate Fo of the oxygen gas to the second flow rate Fsi of the silicon source gas when the silicon oxide film is deposited at a substrate temperature of 300° C. followed by no heat treatment. If the ratio of the first flow rate Fo of the oxygen gas to the second flow rate Fsi of the silicon source gas is decreased from 20, then the fixed oxide charge density of the silicon oxide film is rapidly increased. If the ratio of the first flow rate Fo of the oxygen gas to the second flow rate Fsi of the silicon source gas is increased from 20, then the fixed oxide charge density of the silicon oxide film is gradually decreased. Namely, if the ratio of the first flow rate Fo of the oxygen gas to the second flow rate Fsi of the silicon source gas is not lower than 20, then the fixed oxide charge density of the silicon oxide film remains lower than about $1 \times 10^{-12}$ cm$^{-2}$. In order to obtain the silicon oxide film having the lower fixed oxide charge density than about $1 \times 10^{-12}$ cm$^{-2}$, it is required that the silicon oxide film is deposited under the condition that the ratio of the first flow rate Fo of the oxygen gas to the second flow rate Fsi of the silicon source gas is not lower than 20.

A dotted line represents variations in fixed charge density of the silicon oxide film versus a ratio of the first flow rate Fo of the oxygen gas to the second flow rate Fsi of the silicon source gas when the silicon oxide film is deposited at a substrate temperature of 350° C. followed by no heat treatment. If the ratio of the first flow rate Fo of the oxygen gas to the second flow rate Fsi of the silicon source gas is decreased from 20, then the fixed oxide charge density of the silicon oxide film is rapidly increased. If the ratio of the first flow rate Fo of the oxygen gas to the second flow rate Fsi of the silicon source gas is increased from 20, then the fixed oxide charge density of the silicon oxide film is gradually decreased. Namely, if the ratio of the first flow rate Fo of the oxygen gas to the second flow rate Fsi of the silicon source gas is not lower than 20, then the fixed oxide charge density of the silicon oxide film remains lower than $1 \times 10^{-12}$ cm$^{-2}$. In order to obtain the silicon oxide film having the lower fixed oxide charge density than $1 \times 10^{-12}$ cm$^{-2}$, it is required that the silicon oxide film is deposited under the condition that the ratio of the first flow rate Fo of the oxygen gas to the second flow rate Fsi of the silicon source gas is not lower than 20.

A broken line represents variations in fixed oxide charge density of the silicon oxide film versus a ratio of the first flow rate Fo of the oxygen gas to the second flow rate Fsi of the silicon source gas when the silicon oxide film is deposited at a substrate temperature of 300° C. followed by a heat treatment at a temperature of 550° C. for 8 hours. If the ratio of the first flow rate Fo of the oxygen gas to the second flow rate Fsi of the silicon source gas is decreased, then the fixed oxide charge density of the silicon oxide film is gradually increased. If the ratio of the first flow rate Fo of the oxygen gas to the second flow rate Fsi of the silicon source gas is increased, then the fixed oxide charge density of the silicon oxide film is gradually decreased. If the ratio of the first flow rate Fo of the oxygen gas to the second flow rate Fsi of the silicon source gas is not lower than 20, then the fixed oxide charge density of the silicon oxide film remains lower than about $5\times10^{-11}$ cm$^{-2}$. In order to obtain the silicon oxide film having the lower fixed oxide charge density than about $5\times10^{-11}$ cm$^{-2}$, it is required that the silicon oxide film is deposited under the condition that the ratio of the first flow rate Fo of the oxygen gas to the second flow rate Fsi of the silicon source gas is not lower than 20.

By comparing the broken line with the solid line, it is understood that the heat treatment carried out after the deposition of the silicon oxide film drops the fixed oxide charge density of the silicon oxide film. The heat treatment at a higher temperature than 500° C. is effective to obtain a lower value 0.21 as the ratio of the first peak integrated intensity $A_1$ of the first peak belonging to Si—OH to the second peak integrated intensity $A_2$ of the second peak belonging to O—Si—O. If the silicon oxide film is deposited over a glass substrate, the upper limit of the temperature of the heat treatment to the silicon oxide film is about 600° C. In this case, the available temperature range of the heat treatment after the deposition of the silicon oxide film is 500–600° C.

An alternate long and short dash line represents variations in fixed oxide charge density of the silicon oxide film versus a ratio of the first flow rate Fo of the oxygen gas to the second flow rate Fsi of the silicon source gas when the silicon oxide film is deposited at a substrate temperature of 350° C. followed by a heat treatment at a temperature of 550° C. for 8 hours. If the ratio of the first flow rate Fo of the oxygen gas to the second flow rate Fsi of the silicon source gas is decreased, then the fixed oxide charge density of the silicon oxide film is gradually increased. If the ratio of the first flow rate Fo of the oxygen gas to the second flow rate Fsi of the silicon source gas is increased, then the fixed oxide charge density of the silicon oxide film is gradually decreased. If the ratio of the first flow rate Fo of the oxygen gas to the second flow rate Fsi of the silicon source gas is not lower than 20, then the fixed oxide charge density of the silicon oxide film remains lower than about $7\times10^{-11}$ cm$^{-2}$. In order to obtain the silicon oxide film having the lower fixed oxide charge density than about $7\times10^{-11}$ cm$^{-2}$, it is required that the silicon oxide film is deposited under the condition that the ratio of the first flow rate Fo of the oxygen gas to the second flow rate Fsi of the silicon source gas is not lower than 20.

By comparing the alternative long and short dash line with the dotted line, it is understood that the heat treatment carried out after the deposition of the silicon oxide film drops the fixed oxide charge density of the silicon oxide film. The heat treatment at a higher temperature than 500° C. is effective to obtain a lower value 0.21 as the ratio of the first peak integrated intensity $A_1$ of the first peak belonging to Si—OH to the second peak integrated intensity $A_2$ of the second peak belonging to O—Si—O. If the silicon oxide film is deposited over a glass substrate, the upper limit of the temperature of the heat treatment to the silicon oxide film is about 600° C. In this case, the available temperature range of the heat treatment after the deposition of the silicon oxide film is 500–600° C.

Figure 6:
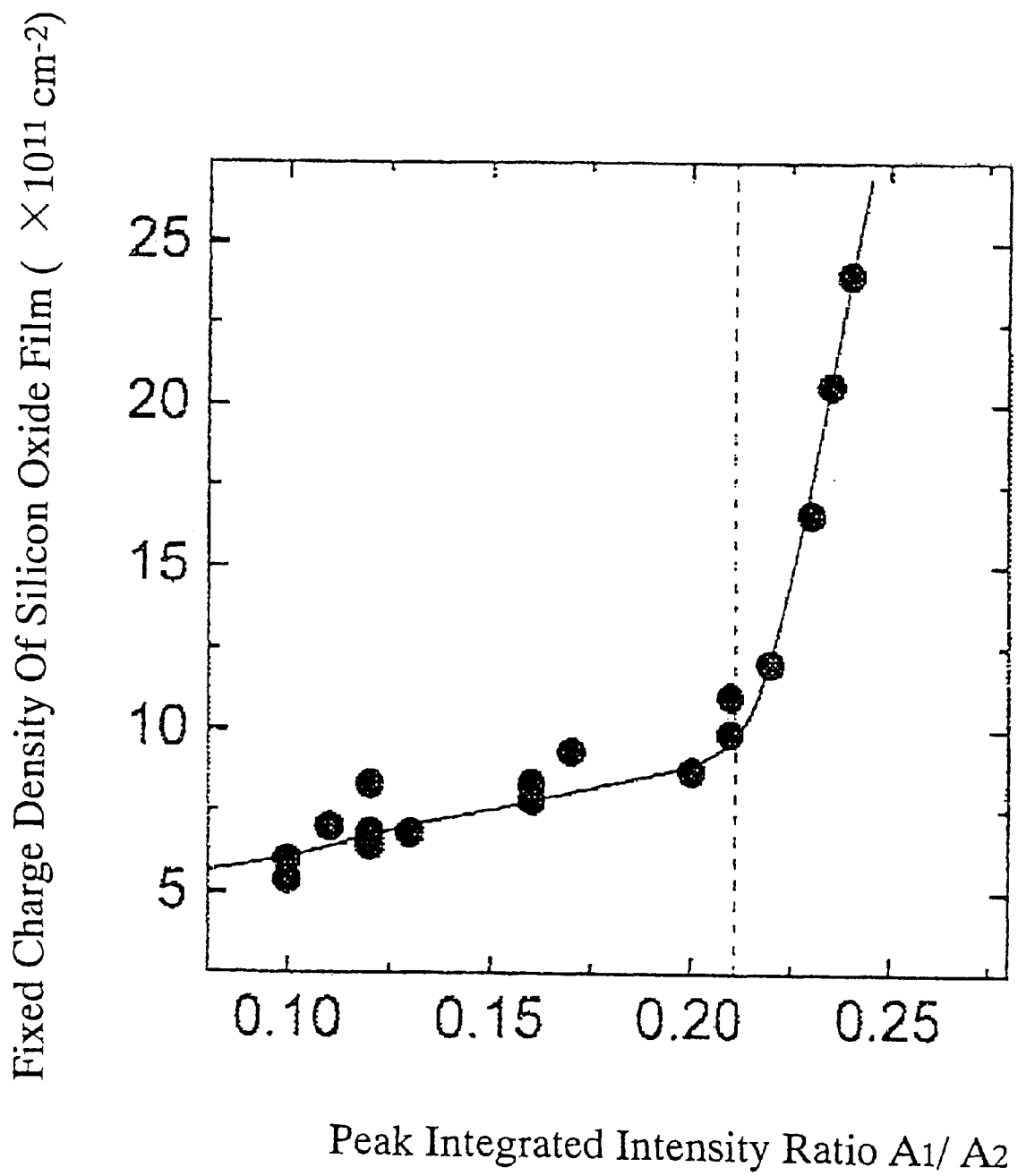
FIG. 6 is a diagram illustrative of variations in fixed charge density in the silicon oxide film versus a ratio of the first peak integrated intensity $A_1$ of the first peak belonging to Si—OH to the second peak integrated intensity $A_2$ of the second peak belonging to O—Si—O in accordance with the present invention.

FIG. 6 is a diagram illustrative of variations in fixed oxide charge density in the silicon oxide film versus a ratio of the first peak integrated intensity $A_1$ of the first peak belonging to Si—OH to the second peak integrated intensity $A_2$ of the second peak belonging to O—Si—O. If the ratio of the first peak integrated intensity $A_1$ of the first peak belonging to Si—OH to the second peak integrated intensity $A_2$ of the second peak belonging to O—Si—O is decreased from 0.21, then the fixed oxide charge density of the silicon oxide film is gradually decreased. If the ratio of the first peak integrated intensity $A_1$ of the first peak belonging to Si—OH to the second peak integrated intensity $A_2$ of the second peak belonging to O—Si—O is increased from 0.21, then the fixed oxide charge density of the silicon oxide film is rapidly increased. If the ratio of the first peak integrated intensity $A_1$ of the first peak belonging to Si—OH to the second peak integrated intensity $A_2$ of the second peak belonging to O—Si—O is not higher than 0.21, then the fixed oxide charge density of the silicon oxide film remains lower than about $1\times10^{-12}$ cm$^{-2}$. In order to obtain the silicon oxide film having the lower fixed oxide charge density than about $1\times10^{-12}$ cm$^{-2}$, it is required that the silicon oxide film is deposited under the condition that the ratio of the first peak integrated intensity $A_1$ of the first peak belonging to Si—OH to the second peak integrated intensity $A_2$ of the second peak belonging to O—Si—O is not higher than 0.21. As described above, the ratio of the first peak integrated intensity $A_1$ of the first peak belonging to Si—OH to the second peak integrated intensity $A_2$ of the second peak belonging to O—Si—O depends upon the content of the hydroxyl group materials in the silicon oxide film. This means that the above value 0.21 is a critical value providing am upper limit of the content of the hydroxyl group materials in the silicon oxide film. If the ratio of the first peak integrated intensity $A_1$ of the first peak belonging to Si—OH to the second peak integrated intensity $A_2$ of the second peak belonging to O—Si—O is not higher than 0.21, this mans that the silicon oxide film has the required high quality and a sufficiently reduced content of the hydroxyl group materials and is excellent in electric properties and characteristics.

As described above, in order to obtain a low ratio of the first peak integrated intensity $A_1$ of the first peak belonging to Si—OH to the second peak integrated intensity $A_2$ of the second peak belonging to O—Si—O, it is required to increase the ratio of the first flow rate Fo of the oxygen gas to the second flow rate Fsi of the silicon source gas. However, the higher ratio of the first flow rate Fo of the oxygen gas to the second flow rate Fsi of the silicon source gas may raise a problem with variation in thickness of the silicon oxide film or a large thickness distribution of the silicon oxide film. If the variation in thickness of the silicon oxide film is excessively large, it might be impossible to use the silicon oxide film for the semiconductor device. The high ratio of the first flow rate Fo of the oxygen gas to the second flow rate Fsi of the silicon source gas means that the deposition is made by supplying monosilane under the oxygen-excess condition. When monosilane is supplied under the oxygen-excess condition, then the reaction of monosilane with oxygen is caused in an extremely short time after monosilane is exposed to the oxygen radical atmosphere. Namely, the supply of monosilane is controlled. For those reasons, if the shape of a monosilane injector or the shape of a mesh region of an intermediate mesh plate is largely different from the shape of the substrate, this results in a large variation in gas concentration in a space over the substrate. Deposition rate of the silicon oxide film is largely varied over position of the substrate. This results in a large variation in thickness of the deposited silicon oxide film. For example, the conventional remote plasma enhanced chemical vapor deposition chamber has circular-shaped parts, for which reason such the conventional remote plasma enhanced chemical vapor deposition chamber is applicable to circular-shaped substrates such as silicon wafers but inapplicable to rectangular-shaped glass substrates for liquid crystal display devices. Namely, if the conventional remote plasma enhanced chemical vapor deposition chamber having the circular-shaped parts is used, it is possible to uniformly deposit the silicon oxide film over the circular-shaped substrate whereby the silicon oxide film deposited has a uniform thickness. If, however, the conventional remote plasma enhanced chemical vapor deposition chamber having the circular-shaped parts is used for deposition of the silicon oxide film over the rectangular-shaped substrate for liquid crystal display device, then it is difficult to uniformly deposit the silicon oxide film over the rectangular-shaped glass substrate.

Accordingly, the fifth aspect of the present invention provides a parallel-plate remote plasma enhanced chemical vapor deposition apparatus having an intermediate mesh plate electrode which isolates a plasma generation region from a silicon source gas injector and a deposition region, wherein the intermediate mesh plate electrode has a rectangular shaped mesh region and the silicon source gas injector comprises a rectangular-shaped frame having four sides, each of which has a plurality of gas injection holes for allowing a uniform gas concentration in a space over a rectangular-shaped substrate, whereby a silicon oxide film deposited on the rectangular-shaped substrate has a uniform thickness.

It is preferable that the rectangular shaped mesh region and the rectangular-shaped frame have shapes which are geometrically deformed from a rectangular shape of a substrate on which a silicon oxide film is deposited.

The sixth aspect of the present invention provides a parallel-plate remote plasma enhanced chemical vapor deposition apparatus having an intermediate mesh plate electrode which isolates a plasma generation region from a silicon source gas injector and a deposition region, wherein the intermediate mesh plate electrode has a rectangular shaped mesh region and the silicon source gas injector comprises rectangular-shaped grids aligned in matrix, each side of the grids has a plurality of gas injection holes for allowing a uniform gas concentration in a space over a rectangular-shaped substrate, whereby a silicon oxide film deposited on the rectangular-shaped substrate has a uniform thickness.

It is preferable that the rectangular shaped mesh region and the rectangular-shaped grids have shapes which are geometrically deformed from a rectangular shape of a substrate on which a silicon oxide film is deposited.

The seventh aspect of the present invention provides a parallel-plate remote plasma chemical vapor deposition apparatus having an intermediate mesh plate electrode which isolates a plasma generation region from a silicon source gas injector and a deposition region, wherein the intermediate mesh plate electrode has a rectangular shaped mesh region and the silicon source gas injector comprises a rectangular-shaped flat plate having both a plurality of gas injection holes and a plurality of oxygen radial passing holes for allowing a uniform gas concentration in a space over a rectangular-shaped substrate, whereby a silicon oxide film deposited on the rectangular-shaped substrate has a uniform thickness.

It is preferable that the rectangular shaped mesh region and the rectangular-shaped flat plate have shapes which are geometrically deformed from a rectangular shape of a substrate on which a silicon oxide film is deposited.

The eighth aspect of the present invention provides a remote microwave plasma enhanced chemical vapor deposition apparatus having a plasma generation region spaced apart from a silicon source gas injector and a deposition region, wherein the silicon source gas injector comprises a rectangular shaped frame having four sides, each of which has a plurality of gas injection holes for allowing a uniform gas concentration in a space over a rectangular-shaped substrate, whereby a silicon oxide film deposited on the rectangular-shaped substrate has a uniform thickness. It is preferable that the rectangular-shaped frame has a shape which is geometrically deformed from a rectangular shape of a substrate on which a silicon oxide film is deposited.

The ninth aspect of the present invention provides a remote microwave plasma enhanced chemical vapor deposition apparatus having a plasma generation region spaced apart from a silicon source gas injector and a deposition region, wherein the silicon source gas injector comprises rectangular-shaped grids aligned in matrix, each side of the grids has a plurality of gas injection holes for allowing a uniform gas concentration in a space over a rectangular-shaped substrate, whereby a silicon oxide film deposited on the rectangular-shaped substrate has a uniform thickness.

It is preferable that the rectangular-shaped grids have shapes which are geometrically deformed from a rectangular shape of a substrate on which a silicon oxide film is deposited.

The tenth present invention provides a remote microwave plasma enhanced chemical vapor deposition apparatus having a plasma generation region spaced apart from a silicon source gas injector and a deposition region, wherein the silicon source gas injector comprises a rectangular-shaped flat plate having both a plurality of gas injection holes and a plurality of oxygen radial passing holes for allowing a uniform gas concentration in a space over a rectangular-shaped substrate, whereby a silicon oxide film deposited on the rectangular-shaped substrate has a uniform thickness.

It is preferable that the rectangular-shaped flat plate has a shape which is geometrically deformed from a rectangular shape of a substrate on which a silicon oxide film is deposited.

The monosilane gas injector may comprise a rectangular frame type gas injector or a rectangular grid type gas injector. If the rectangular grid type gas injector is used, then it is possible to deposit the silicon oxide film more uniformly. The grid type gas injector may have a plurality of gas injection holes provided on grids. The gas injection holes may be directed toward the substrate for injecting the source gas downwardly or toward the substrate. Alternatively, the gas injection holes may be directed in the horizontal direction to the substrate for injecting the source gas in the lateral direction for allowing a uniform gas concentration in a space over a rectangular-shaped substrate, whereby a silicon oxide film deposited on the rectangular-shaped substrate has a uniform thickness.

It is preferable that the mesh region of the intermediate mesh plate has a shape geometrically deformed from the shape of the rectangular shape of the substrate for a uniform concentration of the source gas in a space over the rectangular shaped substrate.

It is also preferable that the frame type monosilane injector also has a shape geometrically deformed from the shape of the rectangular shape of the substrate for a uniform concentration of the source gas in a space over the rectangular shaped substrate.

It is also preferable that the grid type gas injector also has a shape geometrically deformed from the shape of the rectangular shape of the substrate for a uniform concentration of the source gas in a space over the rectangular shaped substrate.

Preferred Embodiments

First Embodiment

Figure 7:
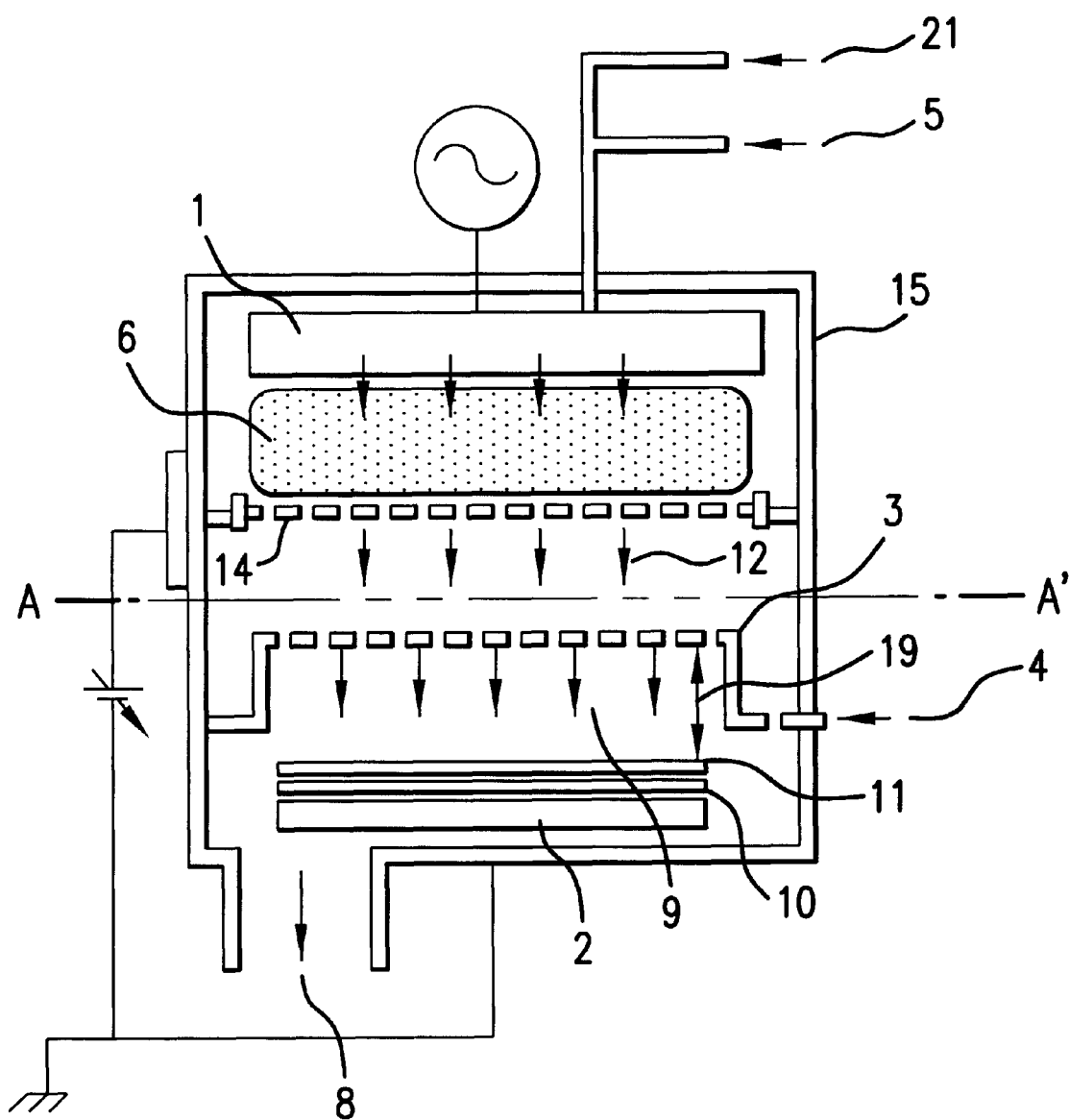
FIG. 7 is a schematic cross sectional elevation view illustrative of a parallel-plate remote plasma enhanced chemical vapor deposition apparatus for deposition of a silicon oxide film over a rectangular-shaped substrate by use of monosilane gas and oxygen gas as source gases in a first embodiment in accordance with the present invention.
Figure 8:
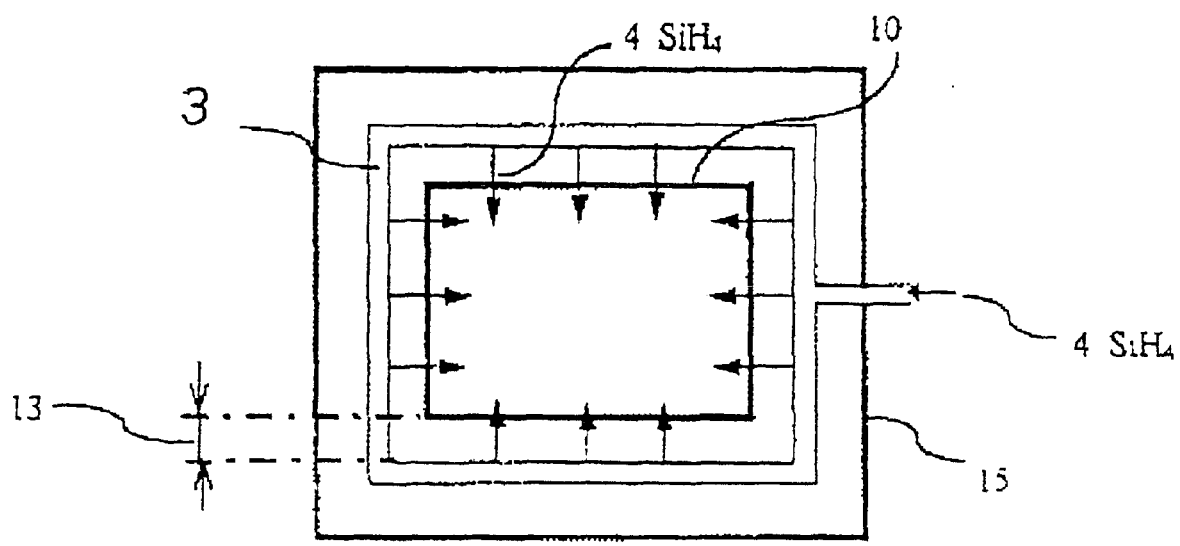
FIG. 8 is a schematic plane view illustrative of a parallel-plate remote plasma enhanced chemical vapor deposition apparatus taken along an A–A' line of FIG. 7 in a first embodiment in accordance with the present invention.

A first embodiment according to the present invention will be described in detail as follows. FIG. 7 is a schematic cross sectional elevation view illustrative of a parallel-plate remote plasma enhanced chemical vapor deposition apparatus for deposition of a silicon oxide film over a rectangular-shaped substrate by use of monosilane gas and oxygen gas as source gases. FIG. 8 is a schematic plan view illustrative of a parallel-plate remote plasma enhanced chemical vapor deposition apparatus taken along an A—A' line of FIG. 7. The parallel-plate remote plasma enhanced chemical vapor deposition apparatus comprises a vacuum chamber, a radio frequency voltage applied electrode 1 which includes a gas shower head and is accommodated in the vacuum chamber, an opposite electrode 2, a rectangular-shaped intermediate mesh plate electrode 14 and a rectangular shaped frame type gas injector 3. The rectangular-shaped intermediate mesh plate electrode 14 has a rectangular-shaped mesh plate on which a large number of holes are formed. A diameter of the holes is almost the same length as Debye-length of oxygen plasma such that oxygen plasma 6 is efficiently confined. The deposition is carried out under the following conditions. A pressure is in the range of 0.1–0.3 Torr. A distance between the radio frequency voltage applied electrode 1 and the rectangular-shaped intermediate mesh plate electrode 14 is 30 millimeters. A radio frequency power density is 0.15 W/cm². Debye length of the oxygen plasma is about 0.2 millimeters. Thus, the diameter of the holes of the rectangular-shaped mesh plate of the rectangular-shaped intermediate mesh plate electrode 14 is 0.15 millimeters. In the two-dimensional space parallel to the substrate surface, a distance 13 between the edge of the substrate 10 and the rectangular shaped frame type gas injector 3 is not less than 20 millimeters so as to avoid that a film having been peeled from the gas injector 3 is dropped onto the substrate 10. In the vertical direction, a distance 19 between the substrate 10 and the rectangular shaped frame type gas injector 3 is 100 millimeters. The distance 19 may be not longer than 150 millimeters under he pressure in the range of 0.1–0.3 Torr since if the rectangular shaped frame type gas injector 3 is excessively distanced from the substrate 10, then precursors 9 for silicon oxide is excessively grown to become particles. The rectangular shaped frame type gas injector 3 has four sides having inside faces, each of which has a plurality of gas injection holes. As modifications, it is also available that the plural gas injection holes are provided on top or bottom faces of the four sides of the rectangular shaped frame type gas injector 3.

A deposition of the silicon oxide film over the rectangular shaped substrate is carried out as follows.

In the vacuumed CVD chamber, an oxygen gas 5 and a helium gas 21 are introduced at gas flow rates of 100–400 sccm and 50–200 sccm respectively into the radio frequency voltage applied electrode 1 having the gas shower head, so that a glow discharge is caused between the radio frequency voltage applied electrode 1 and the rectangular-shaped intermediate mesh plate electrode 14. A discharge power density is 0.15 W/cm². A frequency of a radio frequency power supply is 13.56 MHz. A pressure under which the silicon oxide film is deposited is 0.1 Torr. As modifications, it is also available that the frequency of a radio frequency power supply is 27.12 MHZ, or 40.68 MHz.

As described above, the diameter of the holes of the mesh plate of the rectangular-shaped intermediate mesh plate electrode 14 is 0.15 millimeters which is in the available range of almost equal to or less than Debye-length 0.2 millimeters. For this reason, oxygen and helium plasma 6 are efficiently confined between the radio frequency voltage applied electrode 1 and the rectangular-shaped intermediate mesh plate electrode 14. As a result, a density of the plasma 6 positioned between the radio frequency voltage applied electrode 1 and the rectangular-shaped intermediate mesh plate electrode 14 is about $1\times10^{10}$cm$^{-3}$, whilst a density of the plasma positioned between the opposite electrode 2 and the rectangular-shaped intermediate mesh plate electrode 14 is about $1\times10^{5}$ to $1\times10^{6}$ cm$^{-3}$.

In the oxygen plasma, there exist oxygen ions, electrons and excited oxygen radicals which are electrically neutral. Oxygen ions and electrons move toward the substrate 10 due to an applied electric field and diffusion. Below the rectangular-shaped intermediate mesh plate electrode 14, flux of oxygen ions is much smaller than that of oxygen radical 12. For this reason, oxygen radicals 12 are dominative of formation of the silicon oxide film over the substrate.

The diffused oxygen radicals 12 are reacted with the injected monosilane gas 4 at a flow rate of 10 sccm by the gas injector 3 to form precursors 9 to silicon oxide. The precursors 9 are deposited on the substrate 10 maintained at a substrate temperature of 300° C. or 350° C., whereby a silicon oxide film 11 is formed over the substrate 10. The silicon oxide film 11 is then subjected to a heat treatment at a temperature of 550° C. for 8 hours in an inert gas atmosphere such as nitrogen atmosphere, wherein about 5 liters of nitrogen gas is supplied per one minute.

Since as described above the plasma density is extremely lowered between the opposite electrode 2 and the rectangular-shaped intermediate mesh plate electrode 14, the substrate 10 may receive much smaller damage from the plasma as compared to when the normal parallel-plate plasma enhanced chemical vapor deposition is carried out. This effect is particularly remarkable when a MOS interface is formed over the substrate. If the silicon oxide film is deposited on the single crystal silicon substrate by the normal parallel-plate plasma enhanced chemical vapor deposition method, then an interface state density is in the range of $1\times10^{11}$ to $1\times10^{12}$ eV$^{-1}$. By contrast, if silicon oxide film is deposited on the single crystal silicon substrate by the parallel-plate remote plasma enhanced chemical vapor deposition method, then an interface state density is in the order of $1\times10^{10}$ eV$^{-1}$.

The silicon oxide film is reduced in content of hydroxyl group materials such as water $H_2O$ and silanol Si—OH in the silicon oxide film. The ratio of the first peak integrated intensity $A_1$ of the first peak belonging to Si—OH and appearing in the vicinity of the wave-number of 970 cm$^{-1}$ to the second peak integrated intensity $A_2$ of the second peak belonging to O—Si—O and appearing in the vicinity of a wave-number 820 cm$^{-1}$ depends upon the content of hydroxyl group materials in the silicon oxide film. The above peak integrated intensity ratio $A_1$ to $A_2$ represents the normalization amount of the hydroxyl group materials such as silanol Si—OH in the silicon oxide film. If the peak integrated intensity ratio $A_1$ to $A_2$ is high, this means that the content of the hydroxyl group materials such as water $H_2O$ and silanol Si—OH in the silicon oxide film is also high. If, however, the peak integrated intensity ratio $A_1$ to $A_2$ is low, this means that the content of the hydroxyl group materials such as water $H_2O$ and silanol Si—OH in the silicon oxide film is also low.

FIG. 3 is a diagram illustrative of a typical Raman spectrum of the silicon oxide film. This Raman spectrum is obtained by Raman scattering spectroscopic analysis of the silicon oxide film. A peak belonging to an $\omega_1$-mode of O—Si—O network appears in the vicinity of a wave-number of 450–500 $cm^{-1}$. A peak belonging to an $\omega 3$-mode of O—Si—O network appears in the vicinity of a wave-number of 820 $cm^{-1}$. A peak belonging to a stretch mode of Si—OH bonding appears in the vicinity of a wave-number of 970 $cm^{-1}$.

FIG. 4 is a diagram illustrative of variations in a ratio of the first peak integrated intensity $A_1$ of the first peak belonging to Si—OH to the second peak integrated intensity $A_2$ of the second peak belonging to O—Si—O versus a ratio of the first flow rate Fo of oxygen gas to the second flow rate Fsi of the silicon source gas. A solid line represents the variation in ratio of the first peak integrated intensity $A_1$ to the second peak integrated intensity $A_2$ versus the ratio of the first flow rate Fo to the second flow rate Fsi when the silicon oxide film has been deposited at a substrate temperature of 300° C. followed by no heat treatment. A dotted line represents the variation in ratio of the first peak integrated intensity $A_1$ to the second peak integrated intensity $A_2$ versus the ratio of the first flow rate Fo to the second flow rate Fsi when the silicon oxide film has been deposited at a substrate temperature of 350° C. followed by no heat treatment. A broken line represents the variation in ratio of the first peak integrated intensity $A_1$ to the second peak integrated intensity $A_2$ versus the ratio of the first flow rate Fo to the second flow rate Fsi when the silicon oxide film has been deposited at a substrate temperature of 300° C. followed by a heat treatment at a temperature of 550° C. for 8 hours. An alternate long and short dash line represents the variation in ratio of the first peak integrated intensity $A_1$ to the second peak integrated intensity $A_2$ versus the ratio of the first flow rate Fo to the second flow rate Fsi when the silicon oxide film has been deposited at a substrate temperature of 350° C. followed by a heat treatment at a temperature of 550° C. for 8 hours.

The real line shows that if the chemical vapor deposition of the silicon oxide film is carried out at the substrate temperature of 300° C. for subsequent no heat treatment, then the increase in the ratio of the first flow rate Fo of the oxygen gas to the second flow rate Fsi of the silicon source gas results in a simple decrease in the ratio of the first peak integrated intensity $A_1$ of the first peak belonging to Si—OH to the second peak integrated intensity $A_2$ of the second peak belonging to O—Si—O. As described above if the peak integrated intensity ratio $A_1$ to $A_2$ is low, this means that the content of the hydroxyl group materials such as water $H_2O$ and silanol Si—OH in the silicon oxide film is also low. Therefore, the increase in the ratio of the first flow rate Fo of the oxygen gas to the second flow rate Fsi of the silicon source gas results in a reduction in the content of the hydroxyl group materials such as water $H_2O$ and silanol Si—OH in the silicon oxide film. In order to obtain the peak integrated intensity ratio $A_1$ to $A_2$ of not higher than 0.21, it is required that the ratio of the first flow rate Fo of the oxygen gas to the second flow rate Fsi of the silicon source gas is not lower than 30. Namely, if the silicon oxide film is deposited by the chemical vapor deposition at the substrate temperature 300° C. for subsequent no heat treatment under the condition that the ratio of the first flow rate Fo of the oxygen gas to the second flow rate Fsi of the silicon source gas is not lower than 30, then the ratio of the first peak integrated intensity $A_1$ of the first peak belonging to Si—OH to the second peak integrated intensity $A_2$ of the second peak belonging to O—Si—O is not higher than 0.21.

Accordingly, if the ratio of the first flow rate Fo of the oxygen gas to the second flow rate Fsi of the silicon source gas is increased, then the ratio of the first peak integrated intensity $A_1$ of the first peak belonging to Si—OH to the second peak integrated intensity $A_2$ of the second peak belonging to O—Si—O is decreased and further the content of the hydroxyl group materials such as water $H_2O$ and silanol Si—OH in the silicon oxide film is also decreased. Considering that the silicon source gas comprises a monosilane, a reaction of oxygen with monosilane is caused. If the reaction is caused under an oxygen rich condition or the ratio of the first flow rate Fo of the oxygen gas to the second flow rate Fsi of the monosilane gas is high, then a larger amount of water is generated than hydrogen. By contrast, if, however, the reaction is caused under a silicon source rich condition or the ratio of the first flow rate Fo of the oxygen gas to the second flow rate Fsi of the monosilane gas is low, then a silicon rich silicon oxide film is formed. This silicon rich silicon oxide film has many defects and a low film density. Namely, the silicon rich silicon oxide film is porous whereby silanol Si—OH is captured and water is absorbed.

The dotted line shows that if the chemical vapor deposition of the silicon oxide film is carried out at the substrate temperature of 350° C. for subsequent no heat treatment, then the increase in the ratio of the first flow rate Fo of the oxygen gas to the second flow rate Fsi of the silicon source gas results in a simple decrease in the ratio of the first peak integrated intensity $A_1$ of the first peak belonging to Si—OH to the second peak integrated intensity $A_2$ of the second peak belonging to O—Si—O. As described above if the peak integrated intensity ratio $A_1$ to $A_2$ is low, this means that the content of the hydroxyl group materials such as water $H_2O$ and silanol Si—OH in the silicon oxide film is also low. Therefore, the increase in the ratio of the first flow rate Fo of the oxygen gas to the second flow rate Fsi of the silicon source gas results in a reduction in the content of the hydroxyl group materials such as water $H_2O$ and silanol Si—OH in the silicon oxide film. In order to obtain the peak integrated intensity ratio $A_1$ to $A_2$ of not higher than 0.21, it is required that the ratio of the first flow rate Fo of the oxygen gas to the second flow rate Fsi of the silicon source gas is not lower than 16. Namely, if the silicon oxide film is deposited by the chemical vapor deposition at the substrate temperature 350° C. for subsequent no heat treatment under the condition that the ratio of the first flow rate Fo of the oxygen gas to the second flow rate Fsi of the silicon source gas is not lower than 16, then the ratio of the first peak integrated intensity $A_1$ of the first peak belonging to Si—OH to the second peak integrated intensity $A_2$ of the second peak belonging to O—Si—O is not higher than 0.21.

Accordingly, if the ratio of the first flow rate Fo of the oxygen gas to the second flow rate Fsi of the silicon source gas is increased, then the ratio of the first peak integrated intensity $A_1$ of the first peak belonging to Si—OH to the second peak integrated intensity $A_2$ of the second peak belonging to O—Si—O is decreased and further the content of the hydroxyl group materials such as water $H_2O$ and silanol Si—OH in the silicon oxide film is also decreased.

Considering that the silicon source gas comprises a monosilane, a reaction of oxygen with monosilane is caused. If the reaction is caused under an oxygen rich condition or the ratio of the first flow rate Fo of the oxygen gas to the second flow rate Fsi of the monosilane gas is high, then a larger amount of water is generated than hydrogen. By contrast, if, however, the reaction is caused under a silicon source rich condition or the ratio of the first flow rate Fo of the oxygen gas to the second flow rate Fsi of the monosilane gas is low, then a silicon rich silicon oxide film is formed. This silicon rich silicon oxide film has many defects and a low film density. Namely, the silicon rich silicon oxide film is porous whereby silanol Si—OH is captured and water is absorbed.

By comparison of the dotted line with the solid line, it is understood that if the silicon oxide film is deposited at the same ratio of the first flow rate Fo of the oxygen gas to the second flow rate Fsi of the monosilane gas, then the higher substrate temperature condition causes the lower ratio of the first peak integrated intensity $A_1$ of the first peak belonging to Si—OH to the second peak integrated intensity $A_2$ of the second peak belonging to O—Si—O and also causes the lower content of the hydroxyl group materials such as water $H_2O$ and silanol Si—OH in the silicon oxide film. Namely, the increase in substrate temperature in the chemical vapor deposition of the silicon oxide film results in drop in the ratio of the first peak integrated intensity $A_1$ of the first peak belonging to Si—OH to the second peak integrated intensity $A_2$ of the second peak belonging to O—Si—O and also drop in the content of the hydroxyl group materials such as water $H_2O$ and silanol Si—OH in the silicon oxide film. In the reaction of oxygen with monosilane during the chemical vapor deposition, hydroxide as a precursor for silanol Si—OH may be adhered on a silicon substrate. However, the thermal energy from the substrate kept at the substrate temperature causes elimination or dissociation of the hydroxide from the silicon substrate whereby the amount of hydroxide as a precursor for silanol Si—OH adhered on the silicon substrate is reduced. For this reason, an amount of the silanol Si—OH formed from hydroxide adhered on the silicon substrate is also reduced.

The broken line shows that if the chemical vapor deposition of the silicon oxide film is carried out at the substrate temperature of 300° C. for subsequent heat treatment at a temperature of 550° C. for 8 hours, then the increase in the ratio of the first flow rate Fo of the oxygen gas to the second flow rate Fsi of the silicon source gas results in a simple decrease in the ratio of the first peak integrated intensity $A_1$ of the first peak belonging to Si—OH to the second peak integrated intensity $A_2$ of the second peak belonging to O—Si—O. As described above if the peak integrated intensity ratio $A_1$ to $A_2$ is low, this means that the content of the hydroxyl group materials such as water $H_2O$ and silanol Si—OH in the silicon oxide film is also low. Therefore, the increase in the ratio of the first flow rate Fo of the oxygen gas to the second flow rate Fsi of the silicon source gas results in a reduction in the content of the hydroxyl group materials such as water $H_2O$ and silanol Si—OH in the silicon oxide film. In order to obtain the peak integrated intensity ratio $A_1$ to $A_2$ of not higher than 0.13, it is required that the ratio of the first flow rate Fo of the oxygen gas to the second flow rate Fsi of the silicon source gas is not lower than 20. Namely, if the silicon oxide film is deposited by the chemical vapor deposition at the substrate temperature 300° C. for subsequent heat treatment at 550° C. for 8 hours under the condition that the ratio of the first flow rate Fo of the oxygen gas to the second flow rate Fsi of the silicon source gas is not lower than 20, then the ratio of the first peak integrated intensity $A_1$ of the first peak belonging to Si—OH to the second peak integrated intensity $A_2$ of the second peak belonging to O—Si—O is not higher than 0.13.

Accordingly, if the ratio of the first flow rate Fo of the oxygen gas to the second flow rate Fsi of the silicon source gas is increased, then the ratio of the first peak integrated intensity $A_1$ of the first peak belonging to Si—OH to the second peak integrated intensity $A_2$ of the second peak belonging to O—Si—O is decreased and further the content of the hydroxyl group materials such as water $H_2O$ and silanol Si—OH in the silicon oxide film is also decreased. Considering that the silicon source gas comprises a monosilane, a reaction of oxygen with monosilane is caused. If the reaction is caused under an oxygen rich condition or the ratio of the first flow rate Fo of the oxygen gas to the second flow rate Fsi of the monosilane gas is high, then a larger amount of water is generated than hydrogen. By contrast, if, however, the reaction is caused under a silicon source rich condition or the ratio of the first flow rate Fo of the oxygen gas to the second flow rate Fsi of the monosilane gas is low, then a silicon rich silicon oxide film is formed. This silicon rich silicon oxide film has many defects and a low film density. Namely, the silicon rich silicon oxide film is porous whereby silanol Si—OH is captured and water is absorbed.

As compared to the broken line with the solid line, it is understood that if the silicon oxide film is deposited at the same substrate temperature and also at the same ratio of the first flow rate Fo of the oxygen gas to the second flow rate Fsi of the monosilane gas, then the heat treatment carried out after the silicon oxide film deposition causes the much lower ratio of the first peak integrated intensity $A_1$ of the first peak belonging to Si—OH to the second peak integrated intensity $A_2$ of the second peak belonging to O—Si—O and also causes much lower content of the hydroxyl group materials such as water $H_2O$ and silanol Si—OH in the silicon oxide film. Namely, the heat treatment after the chemical vapor deposition of the silicon oxide film results in large drop in the ratio of the first peak integrated intensity $A_1$ of the first peak belonging to Si—OH to the second peak integrated intensity $A_2$ of the second peak belonging to O—Si—O and also large drop in the content of the hydroxyl group materials such as water $H_2O$ and silanol Si—OH in the silicon oxide film. The thermal energy given from the heat treatment after the chemical vapor deposition of the silicon oxide film causes dissociation of silanol Si—OH in the silicon oxide film and elimination of silanol Si—OH from the inside of the silicon oxide film. For this reason, the content of the silanol Si—OH in the silicon oxide film is also reduced.

The alternative long and short dash line shows that if the chemical vapor deposition of the silicon oxide film is carried out at the substrate temperature of 350° C. for subsequent heat treatment at 550° C. for 8 hours, then the increase in the ratio of the first flow rate Fo of the oxygen gas to the second flow rate Fsi of the silicon source gas results in a simple decrease in the ratio of the first peak integrated intensity $A_1$ of the first peak belonging to Si—OH to the second peak integrated intensity $A_2$ of the second peak belonging to O—Si—O. As described above if the peak integrated intensity ratio $A_1$ to $A_2$ is low, this means that the content of the hydroxyl group materials such as water $H_2O$ and silanol Si—OH in the silicon oxide film is also low. Therefore, the increase in the ratio of the first flow rate Fo of the oxygen gas to the second flow rate Fsi of the silicon source gas results in a reduction in the content of the hydroxyl group materials such as water $H_2O$ and silanol Si—OH in the silicon oxide film. In order to obtain the peak integrated intensity ratio $A_1$ to $A_2$ of not higher than 0.12, it is required that the ratio of the first flow rate Fo of the oxygen gas to the second flow rate Fsi of the silicon source gas is not lower than 20. Namely, if the silicon oxide film is deposited by the chemical vapor deposition at the substrate temperature 350° C. for subsequent heat treatment at 550° C. for 8 hours under the condition that the ratio of the first flow rate Fo of the oxygen gas to the second flow rate Fsi of the silicon source gas is not lower than 20, then the ratio of the first peak integrated intensity $A_1$ of the first peak belonging to Si—OH to the second peak integrated intensity $A_2$ of the second peak belonging to O—Si—O is not higher than 0.12.

Accordingly, if the ratio of the first flow rate Fo of the oxygen gas to the second flow rate Fsi of the silicon source gas is increased, then the ratio of the first peak integrated intensity $A_1$ of the first peak belonging to Si—OH to the second peak integrated intensity $A_2$ of the second peak belonging to O—Si—O is decreased and further the content of the hydroxyl group materials such as water $H_2O$ and silanol Si—OH in the silicon oxide film is also decreased. Considering that the silicon source gas comprises a monosilane, a reaction of oxygen with monosilane is caused. If the reaction is caused under an oxygen rich condition or the ratio of the first flow rate Fo of the oxygen gas to the second flow rate Fsi of the monosilane gas is high, then a larger amount of water is generated than hydrogen. By contrast, if, however, the reaction is caused under a silicon source rich condition or the ratio of the first flow rate Fo of the oxygen gas to the second flow rate Fsi of the monosilane gas is low, then a silicon rich silicon oxide film is formed. This silicon rich silicon oxide film has many defects and a low film density. Namely, the silicon rich silicon oxide film is porous whereby silanol Si—OH is captured and water is absorbed.

By comparison of the alternative long and short dash line with the broken line, it is understood that if the silicon oxide film is deposited at the same ratio of the first flow rate Fo of the oxygen gas to the second flow rate Fsi of the monosilane gas and thereafter the heat treatment is carried out the same temperature and for the same time, then the higher substrate temperature condition causes the lower ratio of the first peak integrated intensity $A_1$ of the first peak belonging to Si—OH to the second peak integrated intensity $A_2$ of the second peak belonging to O—Si—O and also causes lower content of the hydroxyl group materials such as water $H_2O$ and silanol Si—OH in the silicon oxide film. Namely, the increase in substrate temperature in the chemical vapor deposition of the silicon oxide film results in drop in the ratio of the first peak integrated intensity $A_1$ of the first peak belonging to Si—OH to the second peak integrated intensity $A_2$ of the second peak belonging to O—Si—O and also drop in the content of the hydroxyl group materials such as water $H_2O$ and silanol Si—OH in the silicon oxide film. In the reaction of oxygen with monosilane during the chemical vapor deposition, hydroxide as a precursor for silanol Si—OH may be adhered on a silicon substrate. However, the thermal energy from the substrate kept at the substrate temperature causes elimination or dissociation of the hydroxide from the silicon substrate whereby the amount of hydroxide as a precursor for silanol Si—OH adhered on the silicon substrate is reduced. For this reason, an amount of the silanol Si—OH formed from hydroxide adhered on the silicon substrate is also reduced.

Further, as compared to the alternate long and short dash line with the dotted line, it is understood that if the silicon oxide film is deposited at the same substrate temperature and also at the same ratio of the first flow rate Fo of the oxygen gas to the second flow rate Fsi of the monosilane gas, then the heat treatment carried out after the silicon oxide film deposition causes the much lower ratio of the first peak integrated intensity $A_1$ of the first peak belonging to Si—OH to the second peak integrated intensity $A_2$ of the second peak belonging to O—Si—O and also causes the much lower content of. the hydroxyl group materials such as water $H_2O$ and silanol Si—OH in the silicon oxide film. Namely, the heat treatment after the chemical vapor deposition of the silicon oxide film results in large drop in the ratio of the first peak integrated intensity $A_1$ of the first peak belonging to Si—OH to the second peak integrated intensity $A_2$ of the second peak belonging to O—Si—O and also large drop in the content of the hydroxyl group materials such as water $H_2O$ and silanol Si—OH in the silicon oxide film. The thermal energy given from the heat treatment after the chemical vapor deposition of the silicon oxide film causes dissociation of silanol Si—OH in the silicon oxide film and elimination of silanol Si—OH from the inside of the silicon oxide film. For this reason, the content of the silanol Si—OH in the silicon oxide film is also reduced.

FIG. 5 is a diagram illustrative of variations in fixed oxide charge density in the silicon oxide film versus a ratio of the first flow rate Fo of the oxygen gas to the second flow rate Fsi of the silicon source gas. The fixed oxide charge density is calculated from a flat band voltage obtained from capacitance-voltage characteristics under high frequency conditions of a MOS capacitor wherein the silicon oxide film acts as a gate insulation film. It may be considered that the fixed charges in the silicon oxide film are due to excess silicon or silanol Si—OH. If the silicon oxide film having a small fixed oxide charge density is used as a gate insulation film, this makes it possible to drop a threshold voltage and a reduction in variation of the threshold voltage, thereby allowing the transistor to exhibit high performance. Further, the silicon oxide film having the low fixed charge density is superior in other characteristics such as low leakage of current and low interface state density. For those reasons, the fixed oxide charge density of the silicon oxide film may be used as indicator for electric characteristics or properties of the silicon oxide film.

A solid line represents variations in fixed oxide charge density of the silicon oxide film versus a ratio of the first flow rate Fo of the oxygen gas to the second flow rate Fsi of the silicon source gas when the silicon oxide film is deposited at a substrate temperature of 300° C. followed by no heat treatment. If the ratio of the first flow rate Fo of the oxygen gas to the second flow rate Fsi of the silicon source gas is decreased from 20, then the fixed oxide charge density of the silicon oxide film is rapidly increased. If the ratio of the first flow rate Fo of the oxygen gas to the second flow rate Fsi of the silicon source gas is increased from 20, then the fixed charge density of the silicon oxide film is gradually decreased. Namely, if the ratio of the first flow rate Fo of the oxygen gas to the second flow rate Fsi of the silicon source gas is not lower than 20, then the fixed oxide charge density of the silicon oxide film remains lower than about $1 \times 10^{-12}$ $cm^{-2}$. In order to obtain the silicon oxide film having the lower fixed charge density than about $1 \times 10^{-12}$ $cm^{-2}$, it is required that the silicon oxide film is deposited under the condition that the ratio of the first flow rate Fo of the oxygen gas to the second flow rate Fsi of the silicon source gas is not lower than 20.

A dotted line represents variations in fixed oxide charge density of the silicon oxide film versus a ratio of the first flow rate Fo of the oxygen gas to the second flow rate Fsi of the silicon source gas when the silicon oxide film is deposited at a substrate temperature of 350° C. followed by no heat treatment. If the ratio of the first flow rate Fo of the oxygen gas to the second flow rate Fsi of the silicon source gas is decreased from 20, then the fixed oxide charge density of the silicon oxide film is rapidly increased. If the ratio of the first flow rate Fo of the oxygen gas to the second flow rate Fsi of the silicon source gas is increased from 20, then the fixed oxide charge density of the silicon oxide film is gradually decreased. Namely, if the ratio of the first flow rate Fo of the oxygen gas to the second flow rate Fsi of the silicon source gas is not lower than 20, then the fixed charge density of the silicon oxide film remains lower than $1 \times 10^{-12}$ cm$^{-2}$. In order to obtain the silicon oxide film having the lower fixed charge density than $1 \times 10^{-12}$ cm$^{-2}$, it is required that the silicon oxide film is deposited under the condition that the ratio of the first flow rate Fo of the oxygen gas to the second flow rate Fsi of the silicon source gas is not lower than 20.

A broken line represents variations in fixed oxide charge density of the silicon oxide film versus a ratio of the first flow rate Fo of the oxygen gas to the second flow rate Fsi of the silicon source gas when the silicon oxide film is deposited at a substrate temperature of 300° C. followed by a heat treatment at a temperature of 550° C. for 8 hours. If the ratio of the first flow rate Fo of the oxygen gas to the second flow rate Fsi of the silicon source gas is decreased, then the fixed oxide charge density of the silicon oxide film is gradually increased. If the ratio of the first flow rate Fo of the oxygen gas to the second flow rate Fsi of the silicon source gas is increased, then the fixed oxide charge density of the silicon oxide film is gradually decreased. If the ratio of the first flow rate Fo of the oxygen gas to the second flow rate Fsi of the silicon source gas is not lower than 20, then the fixed oxide charge density of the silicon oxide film remains lower than about $5 \times 10^{-11}$ cm$^{-2}$. In order to obtain the silicon oxide film having the lower fixed charge density than about $5 \times 10^{-11}$ cm$^{-2}$, it is required that the silicon oxide film is deposited under the condition that the ratio of the first flow rate Fo of the oxygen gas to the second flow rate Fsi of the silicon source gas is not lower than 20.

By comparing the broken line with the solid line, it is understood that the heat treatment carried out after the deposition of the silicon oxide drops the fixed oxide charge density of the silicon oxide film. The heat treatment at a higher temperature than 500° C. is effective to obtain a lower value 0.21 as the ratio of the first peak integrated intensity $A_1$ of the first peak belonging to Si—OH to the second peak integrated intensity $A_2$ of the second peak belonging to O—Si—O. If the silicon oxide film is deposited over a glass substrate, the upper limit of the temperature of the heat treatment to the silicon oxide film is about 600° C. In this case, the available temperature range of the heat treatment after the deposition of the silicon oxide film is 500–600° C.

An alternate long and short dash line represents variations in fixed oxide charge density of the silicon oxide film versus a ratio of the first flow rate Fo of the oxygen gas to the second flow rate Fsi of the silicon source gas when the silicon oxide film is deposited at a substrate temperature of 350° C. followed by a heat treatment at a temperature of 550° C. for 8 hours. If the ratio of the first flow rate Fo of the oxygen gas to the second flow rate Fsi of the silicon source gas is decreased, then the fixed oxide charge density of the silicon oxide film is gradually increased. If the ratio of the first flow rate Fo of the oxygen gas to the second flow rate Fsi of the silicon source gas is increased, then the fixed oxide charge density of the silicon oxide film is gradually decreased. If the ratio of the first flow rate Fo of the oxygen gas to the second flow rate Fsi of the silicon source gas is not lower than 20, then the fixed oxide charge density of the silicon oxide film remains lower than about $7 \times 10^{-11}$ cm$^{-2}$. In order to obtain the silicon oxide film having the lower fixed charge density than about $7 \times 10^{-11}$ cm$^{-2}$, it is required that the silicon oxide film is deposited under the condition that the ratio of the first flow rate Fo of the oxygen. gas to the second flow rate Fsi of the silicon source gas is not lower than 20.

By comparing the alternative long and short dash line with the dotted line, it is understood that the heat treatment carried out after the deposition of the silicon oxide film drops the fixed oxide charge density of the silicon oxide film. The heat treatment at a higher temperature than 500° C. is effective to obtain a lower value 0.21 as the ratio of the first peak integrated intensity $A_1$ of the first peak belonging to Si—OH to the second peak integrated intensity $A_2$ of the second peak belonging to O—Si—O. If the silicon oxide film is deposited over a glass substrate, the upper limit of the temperature of the heat treatment to the silicon oxide film is about 600° C. In this case, the available temperature range of the heat treatment after the deposition of the silicon oxide film is 500–600° C.

FIG. 6 is a diagram illustrative of variations in fixed oxide charge density in the silicon oxide film versus a ratio of the first peak integrated intensity $A_1$ of the first peak belonging to Si—OH to the second peak integrated intensity $A_2$ of the second peak belonging to O—Si—O. If the ratio of the first peak integrated intensity $A_1$ of the first peak belonging to Si—OH to the second peak integrated intensity $A_2$ of the second peak belonging to O—Si—O is decreased from 0.21, then the fixed charge density of the silicon oxide film is gradually decreased. If the ratio of the first peak integrated intensity $A_1$ of the first peak belonging to Si—OH to the second peak integrated intensity $A_2$ of the second peak belonging to O—Si—O is increased from 0.21, then the fixed charge density of the silicon oxide film is rapidly increased. If the ratio of the first peak integrated intensity $A_1$ of the first peak belonging to Si—OH to the second peak integrated intensity $A_2$ of the second peak belonging to O—Si—O is not higher than 0.21, then the fixed oxide charge density of the silicon oxide film remains lower than about $1 \times 10^{-12}$ cm$^{-2}$. In order to obtain the silicon oxide film having the lower fixed oxide charge density than about $1 \times 10^{-12}$ cm$^{-2}$, it is required that the silicon oxide film is deposited under the condition that the ratio of the first peak integrated intensity $A_1$ of the first peak belonging to Si—OH to the second peak integrated intensity $A_2$ of the second peak belonging to O—Si—O is not higher than 0.21. As described above, the ratio of the first peak integrated intensity $A_1$ of the first peak belonging to Si—OH to the second peak integrated intensity $A_2$ of the second peak belonging to O—Si—O depends upon the content of the hydroxyl group materials in the silicon oxide film. This means that the above value 0.21 is a critical value providing upper limit of the content of the hydroxyl group materials in the silicon oxide film. If the ratio of the first peak integrated intensity $A_1$ of the first peak belonging to Si—OH to the second peak integrated intensity $A_2$ of the second peak belonging to O—Si—O is not higher than 0.21, this means that the silicon oxide film has the required high quality and a sufficiently reduced content of the hydroxyl group materials and is excellent in electric properties and characteristics.

As described above, in order to obtain a low ratio of the first peak integrated intensity $A_1$ of the first peak belonging to Si—OH to the second peak integrated intensity $A_2$ of the second peak belonging to O—Si—O, it is required to increase the ratio of the first flow rate Fo of the oxygen gas to the second flow rate Fsi of the silicon source gas. However, the higher ratio of the first flow rate Fo of the oxygen gas to the second flow rate Fsi of the silicon source gas may raise a problem with variation in thickness of the silicon oxide film or a large thickness distribution of the silicon oxide film. If the variation in thickness of the silicon oxide film is excessively large, it might impossible to use the silicon oxide film for the semiconductor device. The high ratio of the first flow rate Fo of the oxygen gas to the second flow rate Fsi of the silicon source gas means that the deposition is made by supplying monosilane under the oxygen-excess condition. When monosilane is supplied under the oxygen-excess condition, then the reaction of monosilane with oxygen is caused in an extremely short time after monosilane is exposed to the oxygen radial atmosphere. Namely, the supply of monosilane is controlled. For those reasons, if the shape of a monosilane injector or the shape of a mesh region of an intermediate mesh plate is largely different from the shape of the substrate, this results in a large variation in gas concentration in a space over the substrate. Deposition rate of the silicon oxide film is largely varied over position of the substrate. This results in a large variation in thickness of the deposited silicon oxide film. For example, the conventional remote plasma enhanced chemical vapor deposition chamber has circular-shaped parts, for which reason such the conventional remote plasma enhanced chemical vapor deposition chamber is applicable to circular-shaped substrates such as silicon wafers but inapplicable to rectangular-shaped glass substrates for liquid crystal display devices. Namely, if the conventional remote plasma enhanced chemical vapor deposition chamber having the circular-shaped parts is used, it is possible to uniformly deposit the silicon oxide film over the circular-shaped substrate whereby the silicon oxide film deposited has a uniform thickness. If, however, the conventional remote plasma enhanced chemical vapor deposition chamber having the circular-shaped parts is used for deposition of the silicon oxide film over the rectangular-shaped substrate for liquid crystal display device, then it is difficult to uniformly deposit the silicon oxide film over the rectangular-shaped glass substrate.

Figure 9:
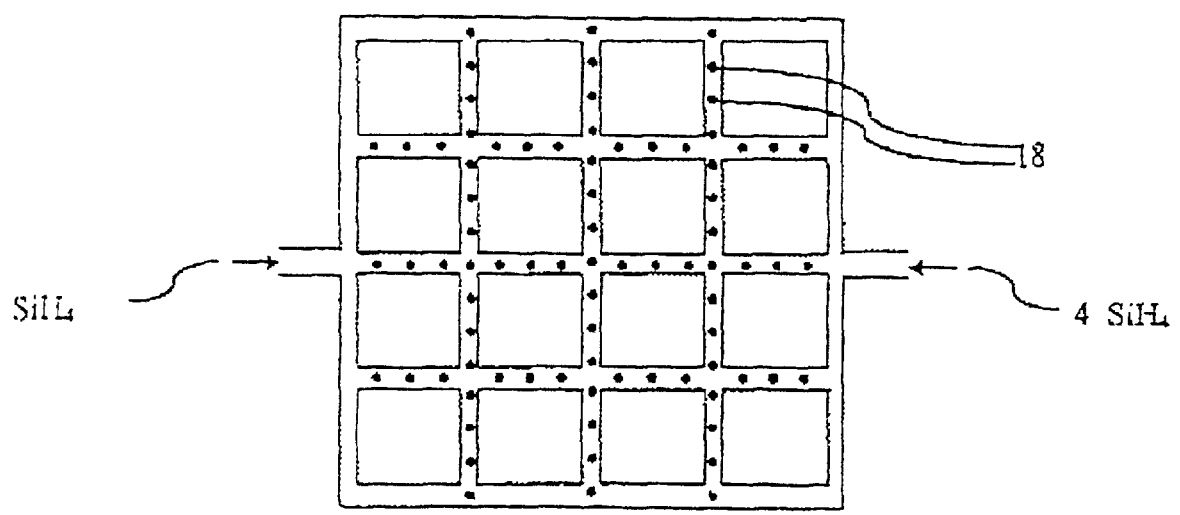
FIG. 9 is a schematic view illustrative of a rectangular grid type gas injector which is available in the parallel-plate remote plasma chemical vapor deposition apparatus of FIG. 7 in a first embodiment in accordance with the present invention.

The monosilane gas injector 3 comprises a rectangular frame type gas injector as illustrated in FIG. 8. FIG. 9 is a schematic view illustrative of a rectangular grid type gas injector which is available in the parallel-plate remote plasma enhanced chemical vapor deposition apparatus of FIG. 7. Alternatively, the monosilane gas injector 3 comprises a rectangular grid type gas injector as illustrated in FIG. 9. If the rectangular grid type gas injector 3 of FIG. 9 is used, then it is possible to deposit the silicon oxide film more uniformly. The grid type gas injector 3 may have a plurality of gas injection holes 18 provided on grids. The gas injection holes 18 may be directed toward the substrate 10 for injecting the source gas downwardly or toward the substrate. Alternatively, the gas injection holes 18 may be directed in the horizontal direction to the substrate 10 for injecting the source gas in the lateral direction for allowing a uniform gas concentration in a space over a rectangular-shaped substrate, whereby the silicon oxide film 11 deposited on the rectangular-shaped substrate has a uniform thickness.

It is preferable that the mesh region of the intermediate mesh plate has a shape geometrically deformed from the shape of the rectangular shape of the substrate for a uniform concentration of the source gas in a space over the rectangular shaped substrate.

It is also preferable that the frame type monosilane injector also has a shape geometrically deformed from the shape of the rectangular shape of the substrate for a uniform concentration of the source gas in a space over the rectangular shaped substrate.

It is also preferable that the grid type gas injector also has a shape geometrically deformed from the shape of the rectangular shape of the substrate for a uniform concentration of the source gas in a space over the rectangular shaped substrate.

Second Embodiment

Figure 10:
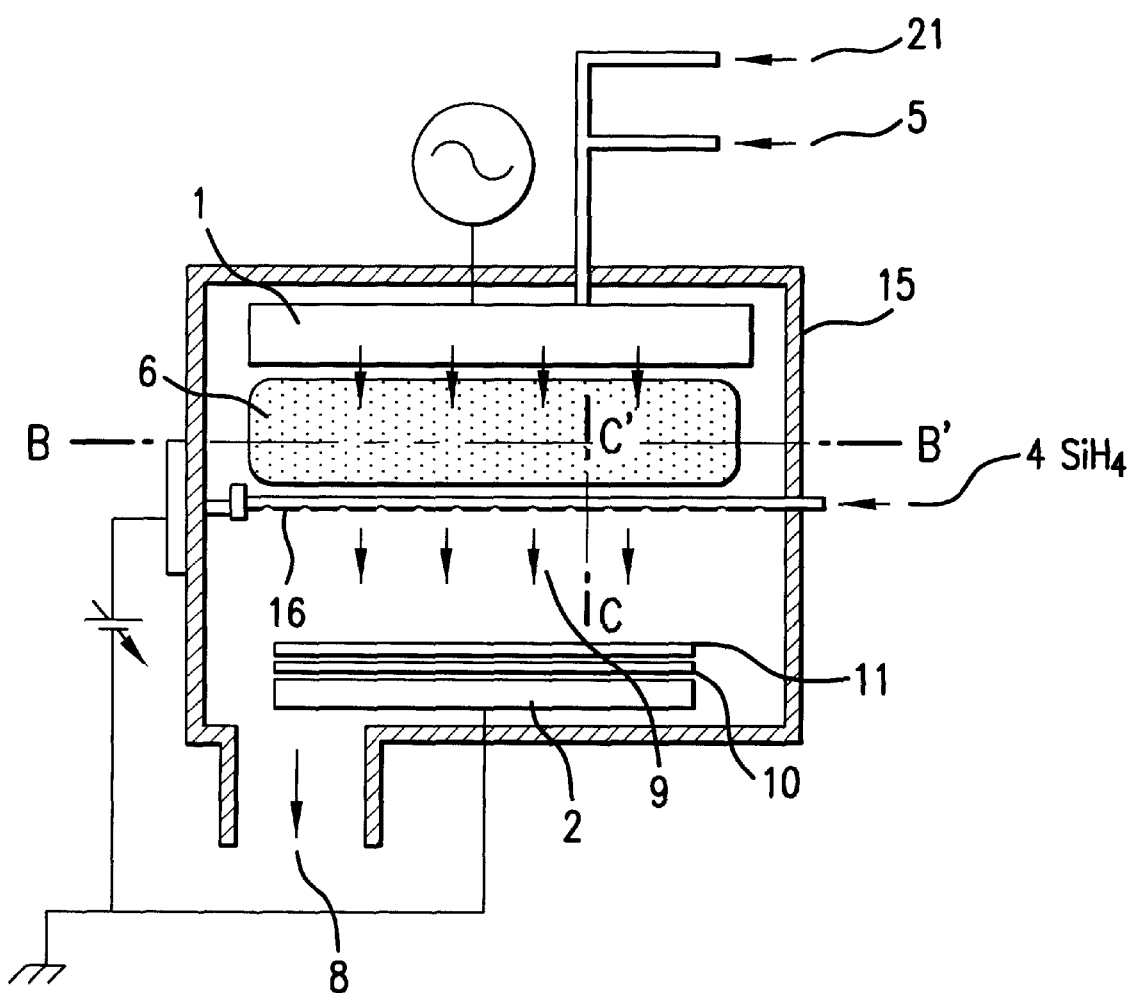
FIG. 10 is a schematic cross sectional elevation view illustrative of a parallel-plate remote plasma chemical vapor deposition apparatus for deposition of a silicon oxide film over a rectangular-shaped substrate by use of monosilane gas and oxygen gas as source gases in a second embodiment in accordance with the present invention.
Figure 11:
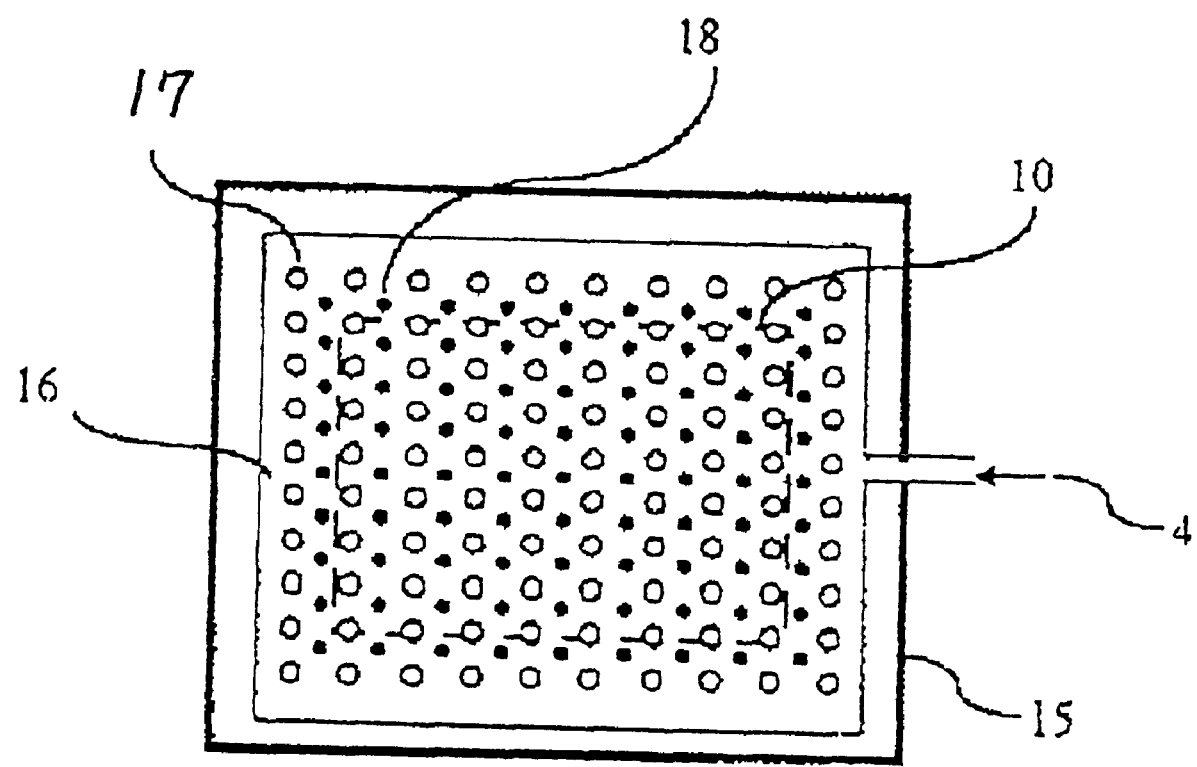
FIG. 11 is a schematic plan view illustrative of a parallel-plate remote plasma enhanced chemical vapor deposition apparatus taken along a B–B' line of FIG. 10 in a second embodiment in accordance with the present invention.
Figure 12:
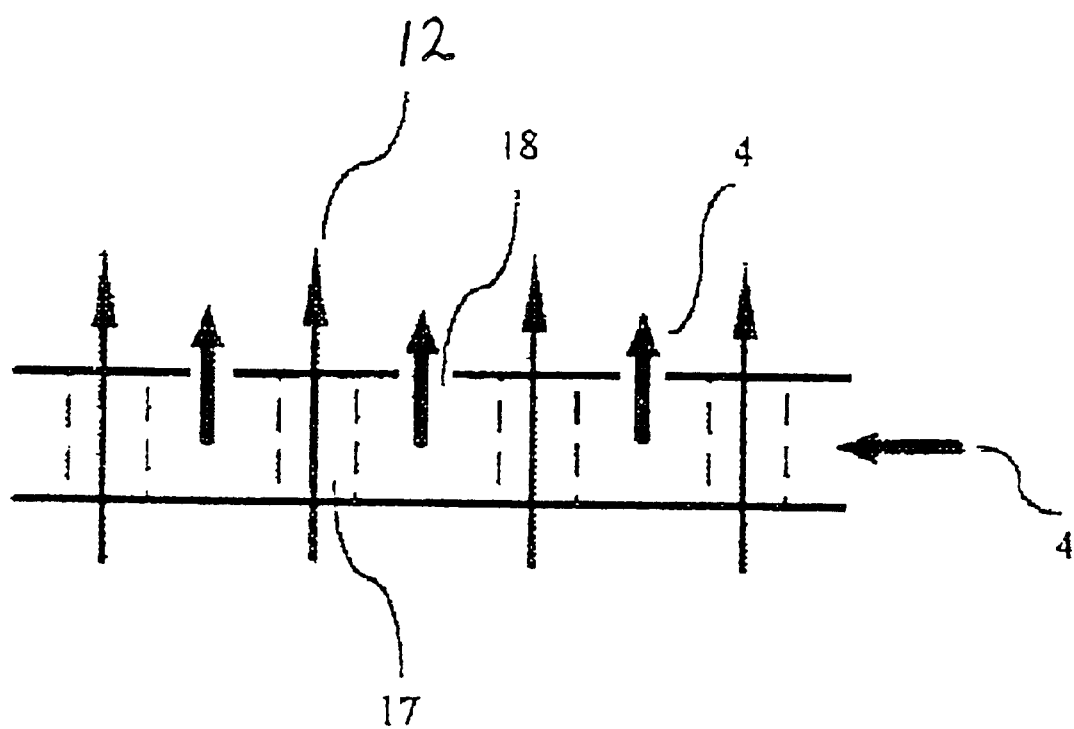
FIG. 12 is a fragmentary cross sectional elevation view illustrative of a rectangular-shaped intermediate mesh plate electrode used in a parallel-plate remote plasma chemical vapor deposition apparatus of FIG. 10 in a second embodiment in accordance with the present invention.

A second embodiment according to the present invention will be described in detail as follows. FIG. 10 is a schematic cross sectional elevation view illustrative of a parallel-plate remote plasma enhanced chemical vapor deposition apparatus for deposition of a silicon oxide film over a rectangular-shaped substrate by use of monosilane gas and oxygen gas as source gases. FIG. 11 is a schematic plan view illustrative of a parallel-plate remote plasma enhanced chemical vapor deposition apparatus taken along a B–B' line of FIG. 10. FIG. 12 is a fragmentary cross sectional elevation view illustrative of a rectangular-shaped intermediate mesh plate electrode used in a parallel-plate remote plasma enhanced chemical vapor deposition apparatus of FIG. 10. The parallel-plate remote plasma enhanced chemical vapor deposition apparatus comprises a vacuum chamber, a radio frequency voltage applied electrode 1 which includes a gas shower head and is accommodated in the vacuum chamber, an opposite electrode 2, and a rectangular-shaped intermediate mesh plate electrode 16. This rectangular-shaped intermediate mesh plate electrode 16 is illustrated in FIG. 11. The rectangular-shaped intermediate mesh plate electrode 16 has a large number of monosilane gas injection holes 18 for injecting monosilane gas and a large number of oxygen radical passing holes 17 through which oxygen radicals pass. Those monosilane gas injection holes 18 and oxygen radical passing holes 17 are separated from each other to avoid causing a reaction of monosilane with oxygen in the rectangular-shaped intermediate mesh plate electrode 16. The monosilane gas injection holes 18 and the oxygen radical passing holes 17 are uniformly distributed over the rectangular-shaped intermediate mesh plate electrode 16 for allowing a uniform deposition of the silicon oxide film over the substrate 10.

It is preferable that the rectangular-shaped intermediate mesh plate electrode 16 has a shape which is geometrically deformed from the rectangular shape of the substrate 10.

A deposition of the silicon oxide film over the rectangular shaped substrate is carried out as follows.

In the vacuumed CVD chamber, an oxygen gas 5 and a helium gas 21 are introduced at gas flow rates of 100–400 sccm and 50–200 sccm respectively into the radio frequency voltage applied electrode 1 having the gas shower head, so that a glow discharge is caused between the radio frequency voltage applied electrode 1 and the rectangular-shaped intermediate mesh plate electrode 16. A discharge power density is 0.15 W/cm$^2$. A frequency of a radio frequency power supply is 13.56 MHz. A pressure under which the silicon oxide film is deposited is 0.1 Torr. As modifications, it is also available that the frequency of a radio frequency power supply is 27.12 MHZ, or 40.68 MHz.

In the oxygen plasma, there exist oxygen ions, electrons and excited oxygen radicals which are electrically neutral. Oxygen ions and electrons move toward the substrate 10 due to an applied electric field and diffusion. Flux of oxygen ions is much smaller than that of oxygen radical 12. For this reason, oxygen radicals 12 are dominative of formation of the silicon oxide film over the substrate.

The diffused oxygen radicals 12 are reacted with the injected monosilane gas 4 at a flow rate of 10 sccm by the gas injector 3 to form precursors 9 to silicon oxide. The precursors 9 are deposited on the substrate 10 maintained at a substrate temperature of 300° C. or 350° C., whereby a silicon oxide film 11 is formed over the substrate 10. The silicon oxide film 11 is then subjected to a heat treatment at a temperature of 550° C. for 8 hours in an inert gas atmosphere such as nitrogen atmosphere, wherein about 5 liters of nitrogen gas is supplied per one minute.

Third Embodiment

Figure 13:
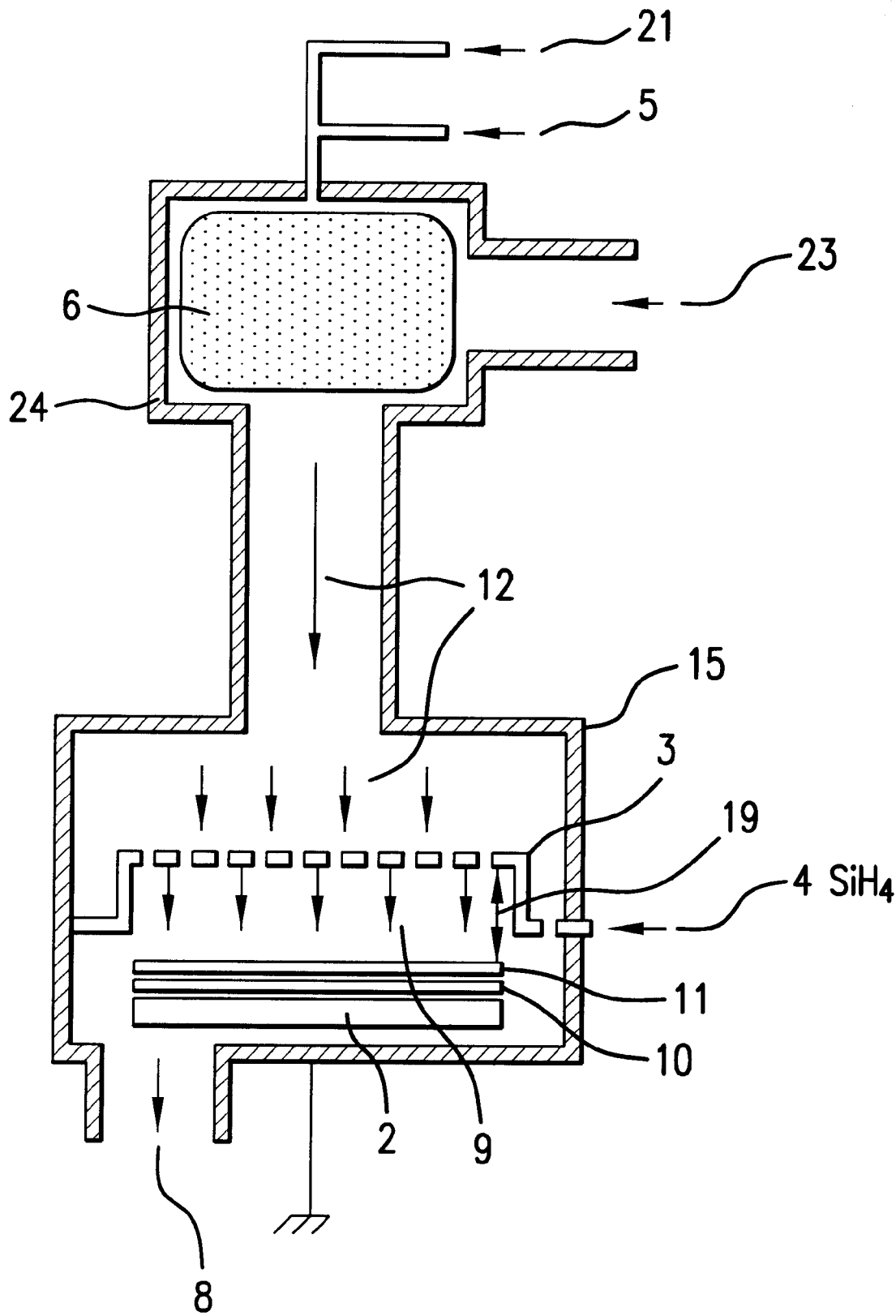
FIG. 13 is a schematic cross sectional elevation view illustrative of a remote microwave plasma chemical vapor deposition apparatus for deposition of a silicon oxide film over a rectangular-shaped glass substrate by use of monosilane gas and oxygen gas as source gases in a third embodiment in accordance with the present invention.

A third embodiment according to the present invention will be described in detail as follows. FIG. 13 is a schematic cross sectional elevation view illustrative of a remote microwave plasma enhanced chemical vapor deposition apparatus for deposition of a silicon oxide film over a rectangular-shaped glass substrate by use of monosilane gas and oxygen gas as source gases. The remote microwave plasma enhanced chemical vapor deposition apparatus comprises a vacuum chamber, a microwave discharge plasma generator which generates a plasma by a microwave 23, an opposite electrode 2, and a rectangular shaped frame type gas injector 3. The rectangular shaped frame type gas injector 3 has four sides having inside faces, each of which has a plurality of gas injection holes. As modifications, it is also available that the plural gas injection holes are provided on top or bottom faces of the four sides of the rectangular shaped frame type gas injector 3.

It is preferable that the rectangular shaped frame type gas injector 3 has a shape which is geometrically deformed from the rectangular shape of the substrate 10.

A deposition of the silicon oxide film over the rectangular shaped substrate is carried out as follows.

In the vacuumed CVD chamber, an oxygen gas 5 and a helium gas 21 are introduced into the microwave discharge plasma generator, so that oxygen and helium plasma 6 are generated. In the oxygen plasma, there exist oxygen ions, electrons and excited oxygen radicals which are electrically neutral. Oxygen ions and electrons move toward the substrate 10 due to an applied electric field and diffusion. Flux of oxygen ions is much smaller than that of oxygen radical 12. For this reason, oxygen radicals 12 are dominative of formation of the silicon oxide film over the substrate. The diffused oxygen radicals 12 are fed to the chamber and reacted with the injected monosilane gas 4 by the gas injector 3 to form precursors 9 to silicon oxide. The precursors 9 are deposited on the substrate 10 maintained at a substrate temperature of 300° C. or 350° C., whereby a silicon oxide film 11 is formed over the substrate 10. The silicon oxide film 11 is then subjected to a heat treatment at a temperature of 550° C. for 8 hours in an inert gas atmosphere such as nitrogen atmosphere, wherein about 5 liters of nitrogen gas is supplied per one minute.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A silicon oxide material having a ratio of $A_1$ to $A_2$ which is not higher than 0.21, where $A_1$ is a first peak integrated intensity of a first peak belonging to Si—OH and appearing in the vicinity of a wave-number 970 $cm^{-1}$, and $A_2$ is a second peak integrated intensity of a second peak belonging to O—Si—O and appearing in the vicinity of a wave-number 820 $cm^{-1}$, and each of said first and second peak integrated intensities is defined as a product of peak width at half height and a peak height of a Raman spectrum obtained by a Raman scattering spectroscopic analysis of said silicon oxide material.

2. The silicon oxide material as claimed in claim 1, wherein said ratio of $A_1$ to $A_2$ is not lower than 0.01.

3. The silicon oxide material as claimed in claim 2, wherein said ratio of $A_1$ to $A_2$ is not lower than 0.05.

4. A silicon oxide film having a ratio of $A_1$ to $A_2$ which is not higher than 0.21, where $A_1$ is a first peak integrated intensity of a first peak belonging to Si—OH and appearing in the vicinity of a wave-number 970 $cm^{-1}$, and $A_2$ is a second peak integrated intensity of a second peak belonging to O—Si—O and appearing in the vicinity of a wave-number 820 $cm^{-1}$, and each of said first and second peak integrated intensities is defined as a product of peak width at half height and a peak height of a Raman spectrum obtained by a Raman scattering spectroscopic analysis of said silicon oxide film.

5. The silicon oxide film as claimed in claim 4, wherein said ratio of $A_1$ to $A_2$ is not lower than 0.01.

6. The silicon oxide film as claimed in claim 5, wherein said ratio of $A_1$ to $A_2$ is not lower than 0.05.

7. The silicon oxide film as claimed in claim 4, wherein said silicon oxide film is in direct contact with a single crystal silicon.

8. The silicon oxide film as claimed in claim 4, wherein said silicon oxide film is in direct contact with a polycrystal silicon.

9. The silicon oxide film as claimed in claim 4, wherein said silicon oxide film is in direct contact with a compound semiconductor.

10. The silicon oxide film as claimed in claim 4, wherein said silicon oxide film is in direct contact with a metal.

11. The silicon oxide film as claimed in claim 4, wherein said silicon oxide film is in direct contact with an insulator.

* * * * *